US009927458B2

(12) United States Patent
Bramhavar et al.

(10) Patent No.: US 9,927,458 B2
(45) Date of Patent: Mar. 27, 2018

(54) APPARATUS AND METHODS FOR PHOTONIC INTEGRATED RESONANT ACCELEROMETER

(71) Applicants: Suraj Deepak Bramhavar, Cambridge, MA (US); Paul William Juodawlkis, Arlington, MA (US)

(72) Inventors: Suraj Deepak Bramhavar, Cambridge, MA (US); Paul William Juodawlkis, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/166,599

(22) Filed: May 27, 2016

(65) Prior Publication Data

US 2016/0349283 A1 Dec. 1, 2016

Related U.S. Application Data

(60) Provisional application No. 62/168,276, filed on May 29, 2015.

(51) Int. Cl.
*G01P 15/093* (2006.01)
*G01P 15/097* (2006.01)

(52) U.S. Cl.
CPC .......... *G01P 15/097* (2013.01); *G01P 15/093* (2013.01)

(58) Field of Classification Search
CPC .............................. G01P 15/093; G01P 15/097
See application file for complete search history.

(56) References Cited

U.S. PATENT DOCUMENTS

| 4,422,331 A | 12/1983 | Walker |
| 6,230,566 B1 | 5/2001 | Lee et al. |
| 6,473,187 B1 | 10/2002 | Manalis |
| 7,324,205 B2 | 1/2008 | Howard |
| 8,848,197 B2 | 9/2014 | Pruessner et al. |
| 2011/0056294 A1 | 3/2011 | Simoni et al. |
| 2014/0174183 A1 | 6/2014 | Comi et al. |

(Continued)

OTHER PUBLICATIONS

Notification of Transmittal of the International Search Report and the Written Opinion of the International Searching Authority in International Application No. PCT/US2016/34580, dated Jan. 19, 2017, 8 pages.

(Continued)

*Primary Examiner* — John Chapman, Jr.
(74) *Attorney, Agent, or Firm* — Cooley LLP

(57) ABSTRACT

The accelerometers disclosed herein provide excellent sensitivity, long-term stability, and low SWaP-C through a combination of photonic integrated circuit technology with standard micro-electromechanical systems (MEMS) technology. Examples of these accelerometers use optical transduction to improve the scale factor of traditional MEMS resonant accelerometers by accurately measuring the resonant frequencies of very small (e.g., about 1 μm) tethers attached to a large (e.g., about 1 mm) proof mass. Some examples use ring resonators to measure the tether frequencies and some other examples use linear resonators to measure the tether frequencies. Potential commercial applications span a wide range from seismic measurement systems to automotive stability controls to inertial guidance to any other application where chip-scale accelerometers are currently deployed.

18 Claims, 29 Drawing Sheets

(56) References Cited

U.S. PATENT DOCUMENTS

2014/0283601 A1 9/2014 Bhave et al.
2015/0020590 A1 1/2015 Painter et al.

OTHER PUBLICATIONS

Anetsberger, Georg, et al. "Measuring nanomechanical motion with an imprecision below the standard quantum limit." Physical Review A 82.6 (2010): 061804.
Anetsberger, Georg, et al. "Near-field cavity optomechanics with nanomechanical oscillators." Nature Physics 5.12 (2009): 909-914.
Basarir et al. "Monolithic integration of a nanomechanical resonator to an optical microdisk cavity." Optics express 20.4 (2012): 4272-4279.
Basarir et al. "Motion transduction in nanoelectromechanical systems (NEMS) arrays using near-field optomechanical coupling." Nano letters 12.2 (2012): 534-539.
Basarir et al. "Sensitive micromechanical displacement detection by scattering evanescent optical waves." Optics letters 35.11 (2010): 1792-1794.
Beyazoglu et al. "A multi-material Q-boosted low phase noise optomechanical oscillator." Micro Electro Mechanical Systems (MEMS), 2014 IEEE 27th International Conference on. IEEE, 2014.
Candler, Rob N., et al. "Single wafer encapsulation of MEMS devices." Advanced Packaging, IEEE Transactions on 26.3 (2003): 227-232.
Cervantes et al. "High sensitivity optomechanical reference accelerometer over 10 kHz." arXiv preprint arXiv:1303.1188 (2013).
Cox et al. "Control of integrated micro-resonator wavelength via balanced homodyne locking." Opt. Express 22.9 (2014): 11279-11289.
Fong et al. "Phase noise of self-sustained optomechanical oscillators." Physical Review A 90.2 (2014): 023825.
Galton, Ian, et al. "A delta-sigma PLL for 14-b, 50 kSample/s frequency-to-digital conversion of a 10 MHz FM signal." Solid-State Circuits, IEEE Journal of 33.12 (1998): 2042-2053.
Grine et al. "Phase noise spectrum and carrier power modeling of high performance optomechanical oscillators." CLEO: QELS_Fundamental Science. Optical Society of America, 2013.
"Accelerex RBA500 Accelerometer, Digitally-compatible frequency output sensor," Honeywell [https://aero1.honeywell.com/inertsensor/docs/rba500.pdf], EXP030, Aug. 2005, 2 pages.
Hopkins et al. "The silicon oscillating accelerometer: A high-performance MEMS accelerometer for precision navigation and strategic guidance applications." Technology Digest (2006): 4.
Hopkins et. al., "The silicon oscillating accelerometer: a high-performance MEMS accelerometer for precision navigation and strategic guidance applications," ION NTM 2005, San Diego, CA, pp. 970-979, (2005).
Hutchinson et al. "Z-Axis Optomechanical Accelerometer," OxideMEMS Laboratory, Cornell University, MEMS 2012, Paris, France, Jan. 29, 2012-Feb. 2, 2012, pp. 615-619.
Krause et al. "A high-resolution microchip optomechanical accelerometer," Nature Photonics 6.11 (2012): 768-772.
Krause et al. "A microchip optomechanical accelerometer—Supplementary Information," Nature Photonics (Jun. 20, 2012), 12 pages.
Krishnamoorthy et al. "In-plane MEMS-based nano-g accelerometer with sub-wavelength optical resonant sensor." *Sensors and Actuators A: Physical* 145 (2008): 283-290.
Luan et al. "An integrated low phase noise radiation-pressure-driven optomechanical oscillator chipset." *Scientific Reports* 4 (2014).
Miao et al. "A microelectromechanically controlled cavity optomechanical sensing system." New Journal of Physics 14.7 (2012): 075015.
Pruessner, et. al., "Integrated waveguide-DBR microcavity optomechanical system," *Optics Express*, vol. 19, No. 22, (2011).
Rocheleau et al. "Enhancement of mechanical Q for low phase noise optomechanical oscillators." Micro Electro Mechanical Systems (MEMS), 2013 IEEE 26th International Conference on. IEEE, 2013.
Seshia, et. Al., "A Vacuum Packaged Surface Micromachined Resonant Accelerometer", JMEMS. Sys., vol. 11, No. 6, pp. 784-793 (2002).
Spector et al. "Silicon photonics devices for integrated analog signal processing and sampling," *Nanophotonics*, 3 (4-5), (2014), 313-327.
Tallur et al. "A monolithic radiation-pressure driven, low phase noise silicon nitride opto-mechanical oscillator." *Optics Express* 19.24 (2011): 24522-24529.
Trusov, et. al., "Silicon Accelerometer With Differential Frequency Modulation and Continuous Self-Calbiration,", 2013 IEEE MEMS Conf., Taipei, Taiwan, pp. 29-32, (2013).
Verbridge et al. "A megahertz nanomechanical resonator with room temperature quality factor over a million." Applied Physics Letters 92.1 (2008): 13112-13112.
Zandi et al. "In-Plane Silicon-On-Insulator Optical Mems Accelerometer Using Waveguide Fabry-Perot Microcavity With Silicon/Air Bragg Mirrors," IEEE (2010), pp. 839-842.

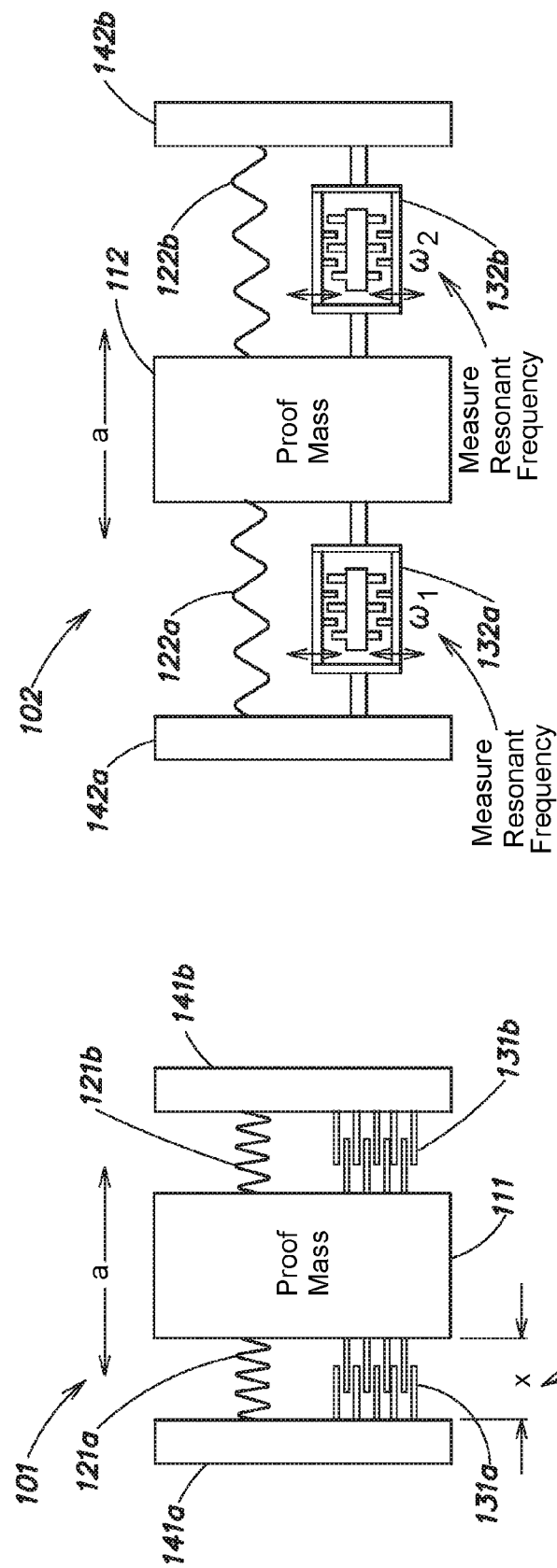

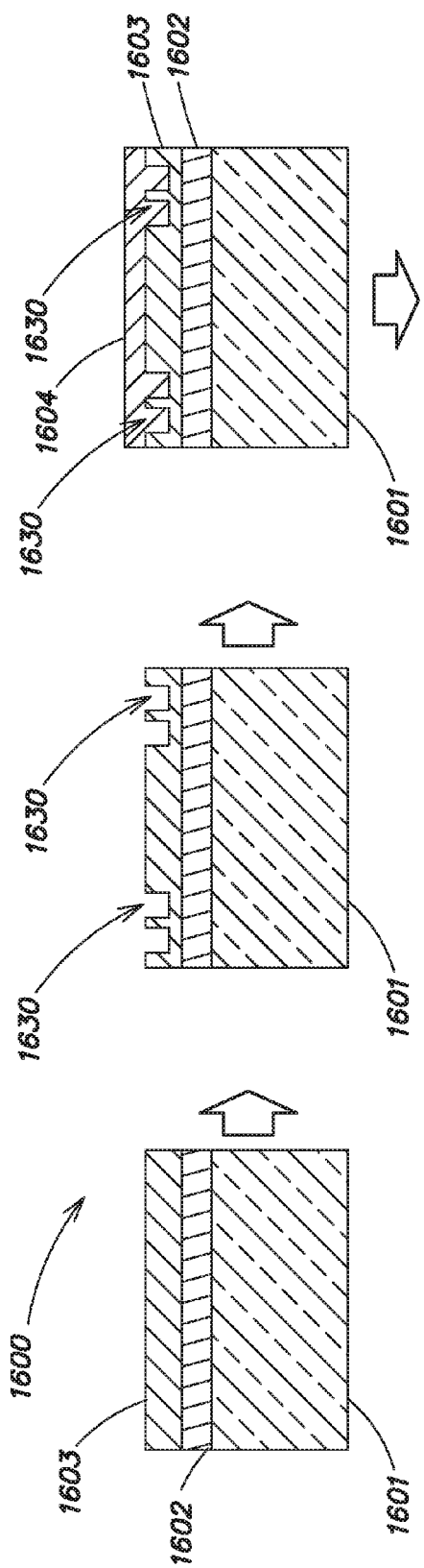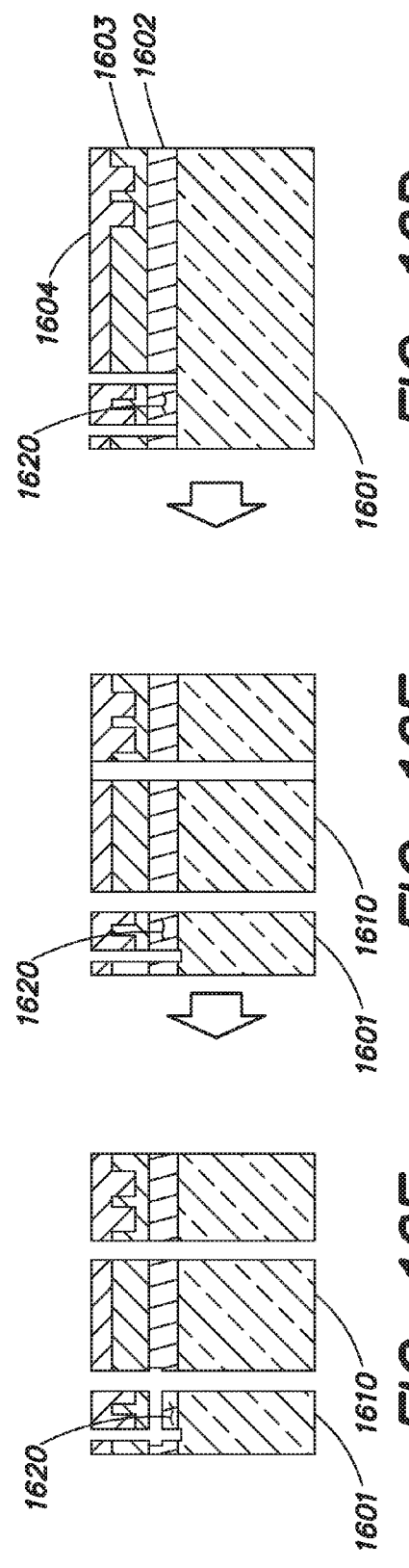

US 9,927,458 B2

APPARATUS AND METHODS FOR PHOTONIC INTEGRATED RESONANT ACCELEROMETER

CROSS-REFERENCES TO RELATED APPLICATIONS

This application claims priority to U.S. provisional application Ser. No. 62/168,276, filed May 29, 2015, entitled "PHOTONIC INTEGRATED RESONANT ACCELEROMETER," which is hereby incorporated herein by reference in its entirety.

GOVERNMENT SUPPORT

This invention was made with Government support under Contract No. FA8721-05-C-0002 awarded by the U.S. Air Force. The Government has certain rights in the invention.

BACKGROUND

Accelerometers can find applications in many areas of technologies. For example, in the automotive industry, acceleration sensing is commonly used for airbag deployment. The computer industry utilizes accelerometers to protect hard disks from large shocks, and the aerospace industry employs inertial measurement units comprising multiple accelerometers and gyroscopes for sensing and navigation. Accelerometers are also used in many personal handheld devices as well, where they can detect the general orientation of the devices.

In many high volume applications, accelerometer devices are made using microelectromechanical system (MEMS) fabrication technologies. These techniques allow batch fabrication in a CMOS process flow and can have the benefit of reductions in size, weight, power, and cost (SWaP-C) while maintaining adequate performance for a variety of applications.

Conventional MEMS accelerometers usually measure the electric charge on a capacitor to detect small movements of a proof mass attached to a spring so as to derive the acceleration of the proof mass. However, it can be challenging for a conventional MEMS accelerator to detect acceleration on the order of sub milliG (1 G=9.8 m/s$^2$) because this level of acceleration may only generate nanovolt changes that are difficult to measure with high precision.

Optically-enabled accelerometers, where the capacitive pickoffs are replaced with an optical transducer, can address the limits of capacitive accelerometers. Existing optical approaches typically rely on measuring small displacements of a mechanical proof mass and translating these displacements into acceleration. Therefore, the sensitivity of an optical accelerator accelerometer depends on the precision of the optical measurement system.

Displacement-based accelerometers can have resolutions down to $10^{-9}$ g, but they also suffer several limitations. First, any small displacement arising from thermal expansion, packaging stress, acceleration in an orthogonal dimension, or other unwanted drift can also be picked up by the measurement system and erroneously translated into acceleration readings. Second, some optically-enabled accelerometers exploit evanescent optical coupling to measure minute displacements, which can place restrictions on the scale factor stability and full scale linear dynamic range of the device when operating in open-loop mode. Third, optical techniques that use highly sensitive interferometric measurement typically also use optical sources with high levels of wavelength stability and precision, creating a significant challenge to be applied in small form factors and in harsh environments.

FIG. 1A shows a schematic of a displacement-based accelerometer 101 including a proof mass 111 suspended by a pair of tethers 121a and 121b from two anchors 141a and 141b. Each side of the proof mass 101 also has a respective measuring element 131a and 131b, connected to the anchors 141a and 141b, to measure the displacement of the proof mass 101 with respect to the anchors 141a and 141b. The accelerometer 101 is limited by the described above trade-off among sensitivity, stability, and dynamic range.

Resonant accelerometers (also referred to as frequency-modulated accelerometers) can relieve the constraints in displacement-based accelerometers by sensing acceleration based on detection of the resonant frequency of the tethers that suspend the proof mass. Acceleration of the proof mass causes opposing changes in the effective stiffness of the tethers, resulting in equal but opposite shifts in their resonant frequencies. Detection of this opposing shift can be utilized to calculate the acceleration of the proof mass, while any mutual shift of the tethers caused by unwanted orthogonal acceleration or temperature drift are cancelled out.

FIG. 1B shows a schematic of a resonant accelerometer 102 including a proof mass 112 suspended from two anchors 142a and 142b by two tethers 122a and 122b, respectively. A pair of vibrating sensing tethers 132a and 132b, including electrostatic comb drives, are also attached between the proof mass 112 and the anchors 142a and 142b.

In operation, the proof mass 102 experiences displacement as a result of applied acceleration. The displacement of the proof mass 102 pulls one of the tethers (e.g., 132a) into tension while pushing the other tether (e.g., 132b) into compression, thereby altering the resonant frequencies of the tethers 132a and 132b. The resonant frequency shifts have equal magnitudes but opposite signs when the acceleration of the proof mass 102 occurs along the desired axis. Any acceleration, and resulting displacement, experienced in orthogonal dimensions can force the tether resonant frequencies to shift together, which allows for a differential measurement and a cancellation of unwanted signals.

The two vibrating sensing tethers 132a and 132b can be excited and detected using the electro-static comb drives. These comb drives can be used to both excite motion in the vibrating sensing tethers 132a and 132b, typically at their natural mechanical resonant frequency, as well as to detect this induced motion including measurement of the resonant frequencies of the vibrating sensing tethers 132a and 132b.

The sensitivity of the resonant accelerometer 102 can be described by the scale factor, or the amount of frequency shift experienced by an individual sensing tether 132a/132b as a result of a given acceleration of the proof mass 102 (e.g., in units of Hz/g). Generally, a larger scale factor is desirable, not only to increase system sensitivity, but also to reduce the impact of unwanted drift in the sensor signal due to temperature and other fluctuations in the surrounding environment over time. For example, in the case where the scale factor is equal to 10 Hz/g and the tether resonant frequency is stable to within 1 Hz over long periods of time, the measured signal, in units of measured acceleration, usually drifts by 0.1 g over this time. If instead the scale factor is increased to 10 kHz/g and the tether frequency stability stays exactly the same, the measured signal may drift by only 0.1 mg.

The scale factor depends on the ratio of the size of the proof mass 102 to the size of the tethers 132a/132b, where larger proof masses and smaller tethers can result in larger scale factors. The size of the sensing tethers 132a/132b is typically limited by the electro-static comb drives that both excite and detect their motion. Smaller tethers can suffer from reduced detection sensitivity, which is dependent on the surface area of the comb. This reduced sensitivity, combined with smaller displacement amplitudes, can make it very difficult to monitor motions of tethers with cross-sectional dimensions of less than 10 microns. This limits the achievable scale factor in conventional MEMS based resonant accelerometers.

SUMMARY

For inertial navigation applications, the inventors have recognized a desire to improve the sensitivity of accelerometers while simultaneously improving the drift stability of the measured signals over long time periods. Since acceleration measurements are integrated twice to retrieve position, any noise in the original signal can produce significant errors in final assumed position. Consequently, there is a large effort to improve the performance of these devices to reduce this measurement error. To date, accelerometers with improved performance typically come at the expense of size and power, moving away from MEMS fabrication technologies to take advantage of a larger proof-mass in order to achieve higher sensitivity and long term stability. The inventors have recognized a desire to break this trade-off and develop accelerometers with excellent sensitivity and long-term stability while maintaining the low SWaP-C of MEMS devices.

Embodiments of the present technology address the desire to provide excellent sensitivity, long-term stability, and low SWaP-C through a combination of photonic integrated circuit technology with standard micro-electromechanical systems (MEMS) technology. Examples of accelerometers disclosed herein may have scale factors greater than 1 kHz/g, which is an order of magnitude better than the current state of the art. In one example, an accelerometer includes a proof mass and a tether, mechanically coupled to a side of the proof mass, to vibrate in response to acceleration of the proof mass. A ring resonator is evanescently coupled to the tether. Vibration of the tether causes a change of the resonance condition of the ring resonator. A detection system is operably coupled to the ring resonator to sense the change of the resonance condition of the ring resonator.

In another example, a method of sensing acceleration with an accelerometer comprising a proof mass, a tether mechanically coupled to a side of the proof mass, and a ring resonator evanescently coupled to the tether is disclosed. The method includes detecting a change of a resonance condition of the first ring resonator caused by vibration of the tether in response to acceleration of the proof mass. The method also includes estimating the acceleration based at least in part on the change of the resonance condition of the ring resonator.

In yet another example, a method of fabricating an accelerometer includes fabricating a ring resonator in a first dielectric layer disposed on a substrate. A second dielectric layer is deposited on the ring resonator so as to fabricate a tether on the second dielectric layer. A proof mass is defined and mechanically coupled to the tether by etching a back surface of the substrate. The method also includes etching the second dielectric layer below the tether so as to release the tether from the ring resonator.

In yet another example, an accelerometer includes a semiconductor substrate and a proof mass suspended from the semiconductor substrate by a first tether and a second tether. A first optical waveguide is optically coupled to the first tether and a second optical waveguide is optically coupled to the second tether. A first photodetector is in optical communication with the first optical waveguide and a second photodetector is in optical communication with the second optical waveguide. In operation, the proof mass moves in a first direction in response to a force applied to the accelerometer. The first optical waveguide guides a first optical beam in a second direction orthogonal to the first direction such that motion of the proof mass causes a change in optical coupling between the first optical waveguide and the first tether. Similarly, the second optical waveguide guides a second optical beam in the second direction such that the motion of the proof mass causes a change in optical coupling between the second optical waveguide and the second tether. And the first and second photodetectors sense changes in the frequencies and/or amplitudes of the first and second optical beams caused by the change in optical couplings between the optical waveguides and the tethers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A shows a schematic of a displacement-based accelerometer.

FIG. 1B shows a schematic of a resonant accelerometer using electrostatic comb drives.

FIGS. 16A-16F illustrate a method of fabricating photonic integrated resonant accelerometers using linear resonators or tether-waveguide interactions.

DETAILED DESCRIPTION

Overview

Figure 2B:
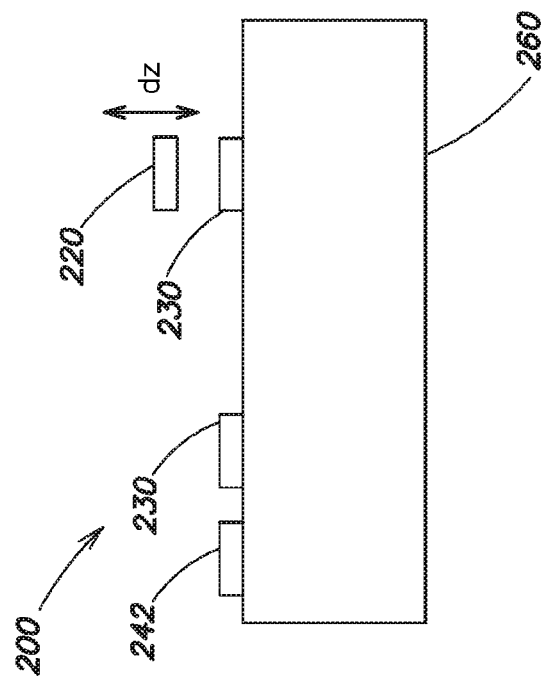
FIGS. 2A-2B show a perspective view and cross sectional view, respectively, of an optical circuit used to detect the tether frequency in an accelerometer.

A Photonic Integrated Resonant Accelerometer (PIRA) can address the limitations in conventional resonant accelerometer by replacing the electrostatic comb drives with optically-sensed tethers. The motion of the tethers can be sensed through evanescent optical interactions using integrated waveguides, and acceleration can be calculated based on shifts in the tether resonance frequencies. For example, the tethers can be evanescently coupled to a ring resonator. Small displacement of the tethers (e.g., induced by the finite temperature of the tether) can perturb the refractive index in the optical mode of the ring resonator such that the resonance undergoes a slight shift. This shift results in a change in the transmitted optical power which can be measured on a photodiode. The frequency at which the transmitted optical power changes gives an indication as to the vibration frequency of the tether, and any shift in this vibration frequency can be used to estimate the acceleration.

In another example, the tether can include photonic materials such as silicon and function as one reflector, which is free to move with the tether, in a resonating structure (e.g., a Fabry-Perot resonator or a distributed Bragg reflector). The other reflector in the resonating structure can be fixed onto a silicon waveguide. The tether motion can change the resonance condition of the resonating structure and accordingly change the transmission power of light propagating in the silicon waveguide. Therefore, the acceleration that causes the proof mass to move can be derived from the transmitted light power by monitoring a shift in the oscillation frequency of the transmitted power.

PIRAs can have several advantages over resonant accelerometers using electrostatic comb drives. First, the cross-sectional dimension of the tether can be dramatically reduced to, for example, on the order of 1 µm or less, which is approximately an order of magnitude smaller compared to tethers currently used in state-of-the-art resonant accelerometers. Reduction of tether dimensions can lead to a large (>10×) improvement in scale factor. Second, the tethers in PIRAs can be made of electrically non-conductive materials such as silicon dioxide or silicon nitride, which can be fabricated using existing mature semiconductor fabrication technologies. Silicon nitride can have excellent mechanical characteristics under harsh environmental conditions. Sensitivity improvements also allow for the use of a stiffer mechanical proof mass, which is more likely to withstand the required levels of shock and vibration.

In addition, interactions between optical and mechanical resonances can be employed to produce opto-mechanical feedback effects, which can turn simple mechanical resonators into self-sustained oscillators with improved phase noise performance. The combination of higher scale factor and excellent frequency stability allows for the possibility to achieve bias stabilities down to the 100 ng level and below. As understood in the art, the bias of an accelerometer can be defined as the average output over a specified time measured at specified operating conditions that have no correlation with input acceleration or rotation. Bias stability refers to the bounds within which the bias may vary over the specified periods of time. Therefore, a lower value of the bias stability can mean that the accelerometer is less prone to noise induced by, for example, environmental changes or other factors.

Furthermore, while the acceleration is measured by the optical circuits, the force-sensing mechanism is governed primarily by the mechanics of the device, including the tension or compression applied to the tethers by the proof mass. As a result, possible drift in optical wavelength or power does not directly correlate to scale factor or bias drift in the measurement. This can relax the performance requirements for the optoelectronic components, which can be a significant advantage compared to other optically-enabled accelerometer concepts.

PIRAs are also compatible with standard silicon photonics processing, where active components such as phase/amplitude modulators and photo detectors can be monolithically integrated alongside passive waveguides, splitters, and couplers. Heterogeneous bonding techniques can also be used to introduce optical sources on-chip as well. As a result, a truly chip-scale accelerometer can be constructed with all of the accompanying optoelectronic components integrated onto the same chip as the suspended micro-mechanical structure. The chip can also be vacuum packaged and either wire or flip chip bonded to additional electronic circuitry for signal processing.

PIRAs Using Ring Resonators

Figure 2A:
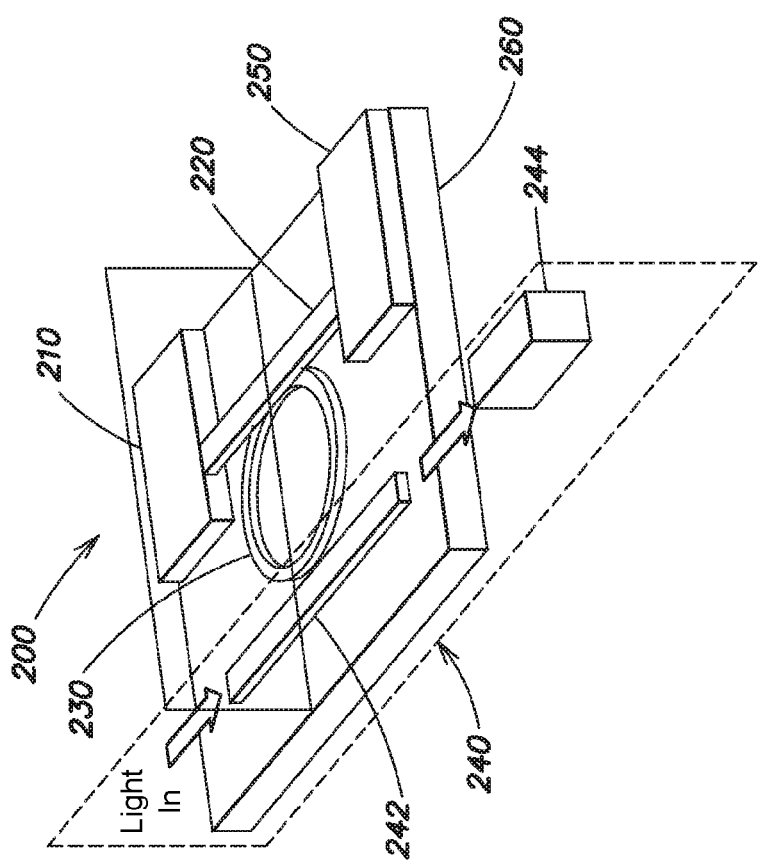

FIGS. 2A and 2B show the perspective view and the cross sectional view, respectively, of a PIRA 200 using ring resonators to sense acceleration. The accelerometer 200 includes a proof mass 210 (only a portion is shown in FIGS. 2A-2B) suspended over a substrate 260 by connecting to an anchor 250 via a tether 220. The proof mass 210 is free to move when an acceleration (or force) is applied to the proof mass 210 but the anchor 250 is fixed. The motion of the proof mass 210 can stretch or squeeze the tether 220 depending on the direction of the acceleration, thereby causing the vibration frequency of the tether 220 to deviate from its characteristic vibration frequency when no stretching or squeezing is applied on the tether 220.

A ring resonator 230 is evanescently coupled to the tether 220 such that displacement of the tether 220 can alter the refractive index experienced by optical modes in the ring resonator 230. In other words, the displacement of the tether 220 can change the resonant condition (e.g., resonance wavelength) of the ring resonator 230. A detection system 240 then detects the change of the resonance condition to monitor the motion of the tether 220, including the vibration frequency, so as to further estimate the acceleration.

The proof mass 210 as shown in FIG. 2A has a rectangular shape for illustrating purposes only. In practice, the proof mass 210 can also be square, round, elliptical, polygonal, or any other suitable shape. It can also be beneficial for the proof mass 210, in response to acceleration, to preferentially flex in the direction along the tether 220 so as to more effectively stretch or compress the tether 220. The material of the proof mass 210 can include, for example, silicon, silicon nitride, or any other material that is compatible with a MEMS fabrication processes such as complementary metal-oxide semiconductor (CMOS) fabrication processes.

The tether 220 in the accelerometer 200 translates the acceleration of the proof mass 210 into a change of its vibration frequency from the characteristic vibration frequency when no force is applied (also referred to as the natural resonant frequency or simply natural frequency). The natural frequency of the tether 220 depends on, for example, the material of the tether 220 and the dimensions of the tether 220.

In one example, the detection system 240, as shown in FIGS. 2A-2B, includes a waveguide 242 evanescently coupled to the ring resonator 230 and a detector 244 optically coupled to the waveguide 242. In operation, a light beam at a wavelength close to the resonant wavelength of the ring resonator 230 can be transmitted through the waveguide 242. At least a portion of the light beam is coupled into the ring resonator 230 due to the evanescent coupling between the waveguide 242 and the ring resonator 230. The transmitted power of the light beam is monitored by the detector 244. When vibration of the tether 220, induced by the acceleration to be detected, perturbs the refractive index experienced by the light beam, the transmitted power changes accordingly and can be recorded by the detector 244 to estimate the vibration frequency the tether 220.

In another example, the light beam transmitted through the waveguide 242 and the ring resonator 230 can be a broadband light beam and the transmitted spectrum of the light beam can be monitored by the detector 244. Typically, spectral components at wavelengths close to the resonant wavelength of the ring resonator 230 are usually trapped within the ring resonator 230, thereby generating a valley in the transmitted spectrum. When motion of the tether 220 changes the resonant condition (including the resonant wavelength) of the ring resonator 230, the location of the valley in the transmitted spectrum changes accordingly. Therefore, the vibration frequency of the tether 220 can be estimated by monitoring the transmitted spectrum of the light beam.

Various materials can be employed to make the tether 220. In general, it can be beneficial for the tether material not to absorb the light beam (e.g., at 1550 nm) propagating in the ring resonator 230 so as to reduce the chance of interference with the measurement of tether frequency. In one example, the tether 220 can include silicon, silicon dioxide, silicon nitride, or any other material that is compatible with MEMS fabrication process (e.g., CMOS process). Silicon nitride also has large internal stress compared to other materials and therefore has low mechanical damping, which can further lead to high quality (Q) factor of the tether vibration and higher sensitivity of the resulting accelerometer. In another example, the tether 220 includes diamond, which has low internal mechanical damping and therefore can also provide high Q factor for the tether 220. In yet another example, the tether 220 can include aluminum nitride (AlN), which has low thermal expansion and therefore is less prone to thermal noises. AlN can be fabrication by, for example, molecular beam epitaxy (MBE), reactive evaporation, pulsed laser deposition (PLD), chemical vapor deposition (CVD), sputtering, and electrophoretic deposition, among others.

The tether 220 can be defined by its width, height, and length. The width of the tether 220 can be about 100 nm to about 2 μm (e.g., 100 nm, 200 nm, 500 nm, 1 μm, 1.5 μm, or 2 μm). The height of the tether 220 can be about 50 nm to about 500 nm (e.g., 50 nm, 100 nm, 200 nm, or 500 nm). The length of the tether 200 can be about 5 μm to about 200 μm (e.g., 5 μm, 10 μm, 20 μm, 50 μm, 100 μm, 150 μm, or 200 μm).

In general, reducing the cross-sectional dimensions (e.g., height and width) of the tether 220 can result in higher sensitivity but may also reduce the linear dynamic range of the accelerometer 200, because smaller tethers tend to buckle or break under strong compression or stretching forces. This effect can be countered by, for example, reducing the length of the tether 220 or increasing the internal tensile stress of the material of the tether 220. Both approaches can increase the natural frequency of the tether. Increasing the internal tensile stress can also reduce the damping of the mechanical resonance, thereby improving the ultimate resolution.

Based on the materials and dimensions described above, the vibration frequency (also referred to as the resonance frequency) of the tether 220 can be about 1 MHz to 1 GHz (e.g., 1 MHz, 10 MHz, 50 MHz, 100 MHz, 200 MHz, 500 MHz, or 1 GHz). These vibration frequencies are at least an order of magnitude higher than the resonant frequencies used in resonant accelerometers based on electrostatic comb drives, which are limited not only by the mechanical structure of the comb drives but also by the requisite transduction circuitry. Optical transduction techniques alleviate these concerns, and can allow for tether resonance frequencies beyond 1 GHz, offering additional design flexibility when navigating the inherent trade-offs of dynamic range versus sensitivity.

The linewidths of the vibration frequency of the tether 220 can be about 1 Hz to about 10 kHz (e.g., 1 Hz, 10 Hz, 50 Hz, 100 Hz, 500 Hz, 1 kHz, 2 kHz, 5 kHz, or 10 kHz). In practice, there can be trade-offs in the choice of tether frequency and linewidths. In general, higher frequencies can result in a larger linear range, but can also make it harder to create narrow linewidths and accordingly higher sensitivity. On the other hand, lower frequencies are usually associated with smaller linewidths and thus can yield good sensitivity. Therefore, it can be beneficial to have large vibration frequencies but small linewidths (e.g., a linewidth less than 50 Hz, less than 20 Hz, less than 10 Hz, less than 2 Hz, less than 1 Hz, or less than 0.5 Hz).

The ring resonator 230 is evanescently coupled to the tether 220 to sense the motion of the tether 220. The strength of the evanescent coupling can depend on the distance between the ring resonator 230 and the tether 220. Generally, a smaller gap between the ring resonator 230 and the tether 220 can result in a stronger interaction between the tether 220 and the light propagating in the ring resonator 230, thereby increasing the sensitivity of the resulting accelerometer. On the other hand, it is also desirable have a sufficiently large gap so as to allow the tether 220 to freely move and vibrate in response to motion of the proof mass 210. In practice, the distance can be about 50 nm to about 500 nm (e.g., 50 nm, 100 nm, 200 nm, 300 nm, or 500 nm).

The gap between the tether 220 and the ring resonator 230 can be filled with gas (e.g., air) or vacuum.

The diameter (and accordingly the resonance wavelength) of the ring resonator 230 depends on, for example, the wavelength of the light beam propagating in the waveguide 242 and the ring resonator 230. In practice, the diameter of the ring resonator 230 can be about 5 µm to about 200 µm (e.g., about 5 µm, 10 µm, 20 µm, 50 µm, 100 µm, 150 µm, or 200 µm). The material of the ring resonator 230 can be, for example, silicon, silicon dioxide, silicon nitride, or any other material known in the art.

Detection of Acceleration Based on Transmission Measurements

Figure 3:
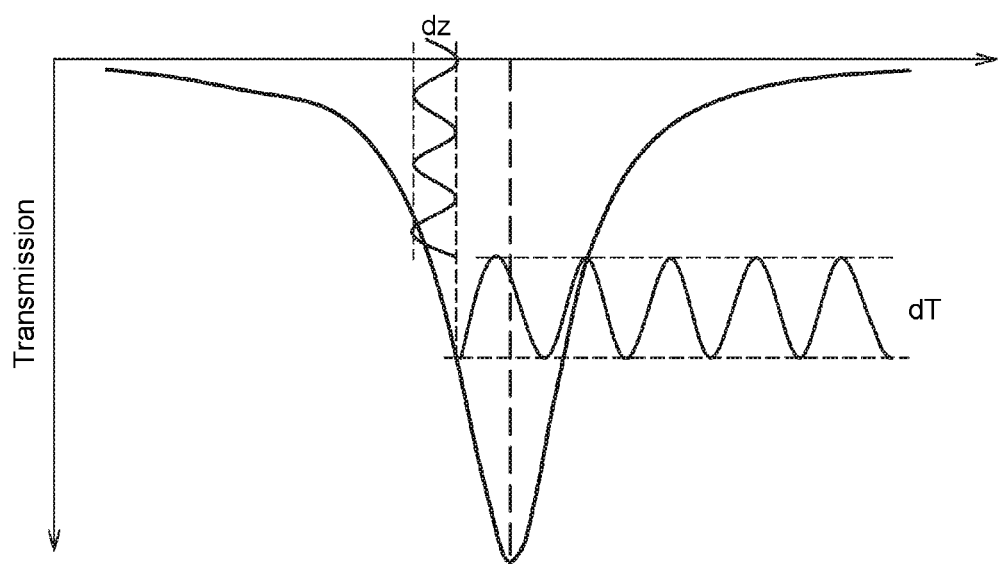
FIG. 3 is an example of transmitted power acquired by the accelerometer shown in FIGS. 2A-2B to illustrate one mechanism of acceleration detection.

FIG. 3 illustrates one method for detecting acceleration using the accelerometer 200 shown in FIGS. 2A-2B, where part of the waveguide in the ring resonator 230 is disposed slightly below the tether 220. When the tether 220 vibrates, the displacement dz is in the vertical direction (z direction) and the distance (also referred to as the gap width) between the tether 220 and the ring resonator 230 changes periodically depending on the vibration frequency of the tether 220. When the tether 220 is in its undisturbed position, the resonant wavelength of the ring oscillator 230 can be substantially equal to the wavelength of the light beam propagating in the waveguide 242 and the transmitted power measured by the detector 244 is low. When the tether 220 is away from its undisturbed position, the resonant wavelength of the ring resonator 230 changes accordingly and deviates from the wavelength of the light propagating in the waveguide 242. In this case, the transmitted power measured by the detector 244 can increase. Therefore, this periodic change in the gap width can induce the oscillation of the power transmission as shown in FIG. 3. Therefore, the vibration frequency of the tether 220 can be derived from the periodicity of the oscillation of the power transmission. Once the vibration frequency and its deviation from the characteristic vibration frequency of the tether 220 are determined, the acceleration that causes such deviation of vibration frequency can be determined accordingly.

PIRAs Including A Pair of Ring Resonators

Figure 4A:
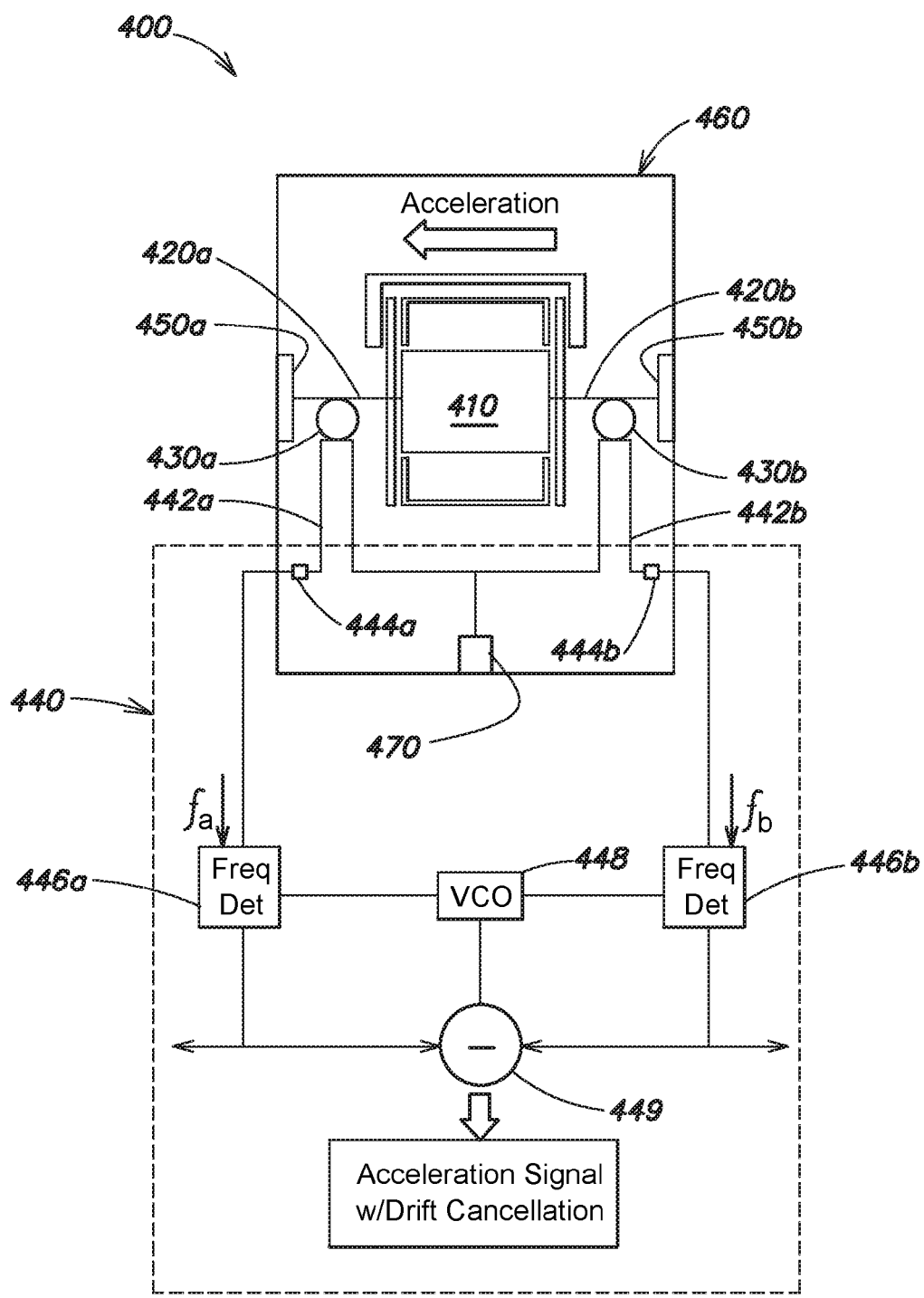
FIGS. 4A-4B show a top view and perspective view, respectively, of a photonic resonant accelerometer using a pair of ring resonators for drift cancellation.
Figure 4B:
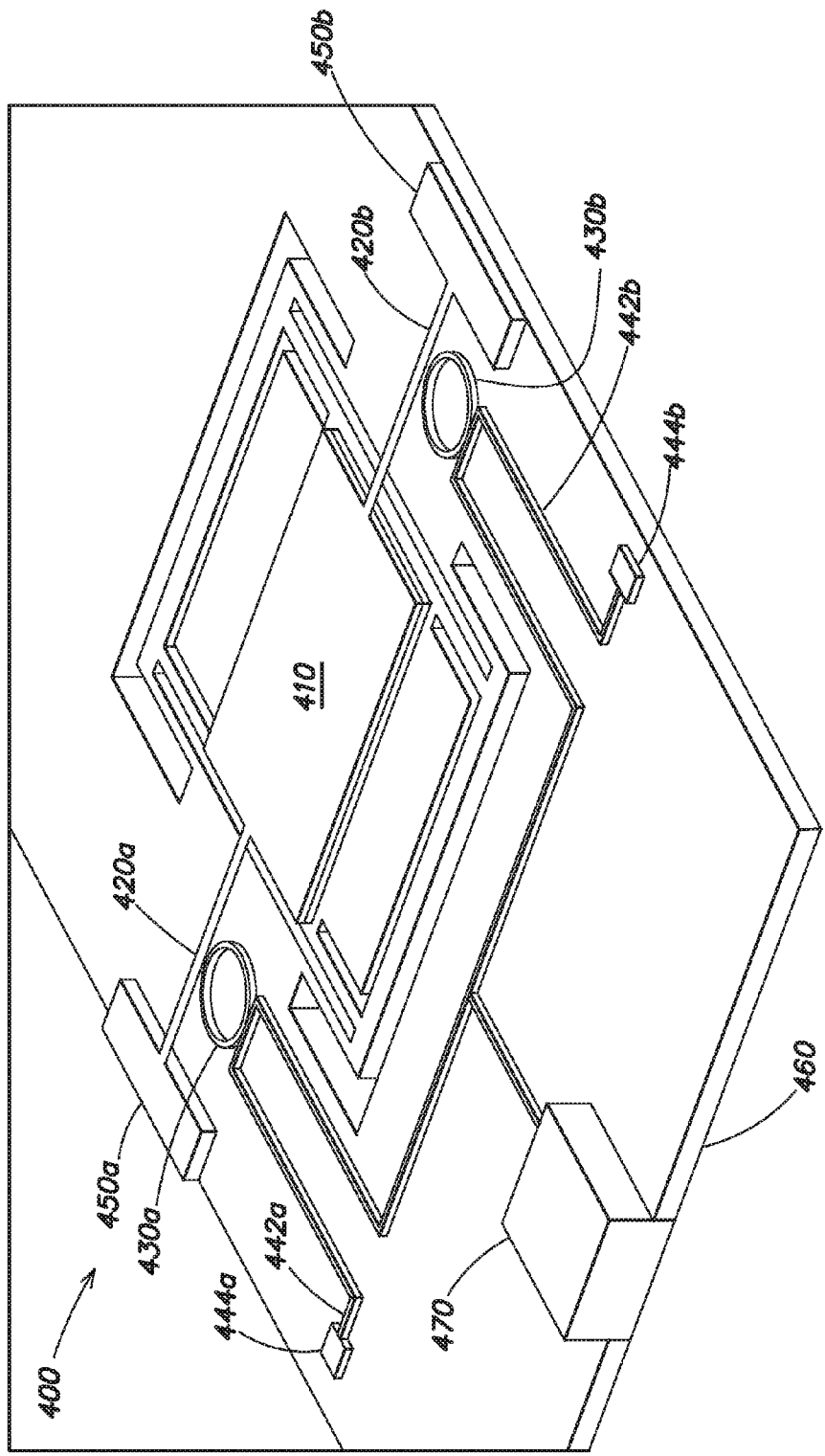

FIGS. 4A and 4B show the top view and perspective view, respectively, of an accelerometer 400 including a pair of ring resonators 430a and 430b (collectively referred to as ring resonators 430) on each side of a proof mass 410 to, for example, cancel out thermal drift in acceleration measurements. The proof mass 410 in the accelerometer 400 is suspended from a pair of anchors 450a and 450b (collectively referred to as anchors 450) by two tethers 420a and 420b (collectively referred to as tethers 420), each of which is attached to one side of the proof mass 410. The anchors 450 are fixed on a substrate 460. Each tether 420a/420b is also evanescently coupled to a respective ring resonator 430a/430b, which can sense the motion of the tether 420a/420b via the change of resonance conditions.

A light source 470 is disposed on the substrate 460 to provide a light beam for a detection system 440 to measure the vibration frequency of the tethers 420 and accordingly estimate the acceleration on the proof mass 410. The light source 470 can include any semiconductor laser. The operating wavelengths of the light source 470 can be, for example, about 1310 nm, or about 1400 nm to about 1600 nm. Light at these wavelengths can travel through silicon photonic circuits with negligible loss. In addition, the light source 470 can be fabricated separately and bonded to the substrate 460 after fabrication. The light beam is split into two parts. The first part of the light beam is transmitted via a waveguide 442a, evanescently coupled to the ring resonators 430a, to a detector 444a that monitors the transmitted beam power of the first part of the light beam. Similarly, the second part of the light beam is transmitted via a waveguide 442b, evanescently coupled to the ring resonators 430b, to a detector 444b that monitors the transmitted beam power of the second part of the light beam. The transmitted powers of the light beam acquired by the detectors 444a and 444b are transmitted to two frequency detectors 446a and 446b, respectively, which can determine the vibration frequencies of the two tethers 420. The frequency detectors 446a and 446b can include commercially available phase/frequency detectors, such as HMC 3716, HMC 984, and HMC 439 manufactured by Analog Devices, or MC100EP140, MCH12140, and MCK12140 manufactured by ON Semiconductors. A voltage-controlled oscillator (VCO) 448 is coupled to the two frequency detectors 446a and 446b to provide an input reference frequency (and/or phase) for the two frequency detectors 446a and 446b.

A processing unit 449 then estimates the acceleration based on the two frequencies detected by the two frequency detectors 446a and 446b. The measured frequency change can be a direct measurement of applied acceleration, i.e., acceleration can be measured by simply measuring the tether frequency. More information about photonic circuits that can perform the measurements can be found in Galton, Ian, et al., A delta-sigma PLL for 14-b, 50 kSample/s frequency-to-digital conversion of a 10 MHz FM signal, Solid-State Circuits, *IEEE Journal of* 33.12 (1998): 2042-2053, which is hereby incorporated herein by reference in its entirety.

Figure 4C:
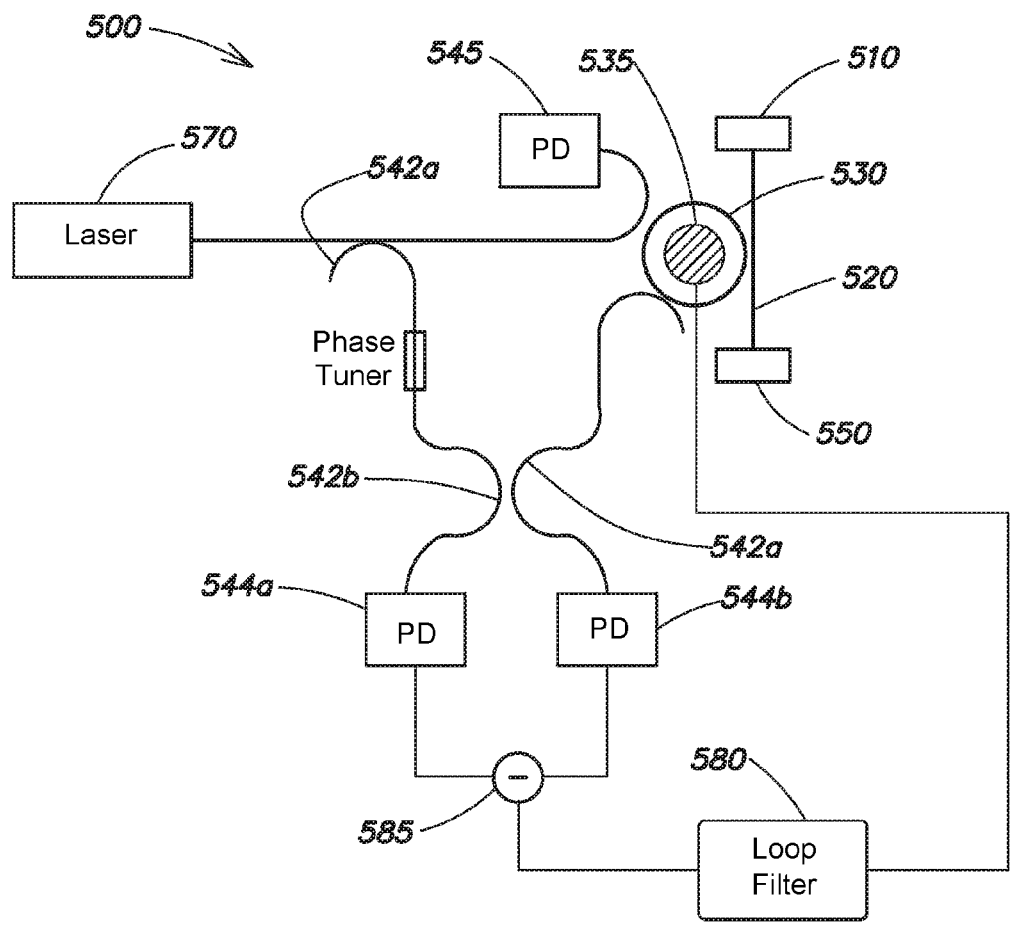
FIG. 4C shows a schematic of a balanced homodyne feedback circuit that can be used in the photonic resonant accelerometer shown in FIGS. 4A-4B.

FIG. 4C shows a schematic of a balanced homodyne feedback circuit 500 that can be used to maintain stable performances of the ring resonators over temperature. The circuit includes a sensing tether 520 connecting a proof mass 510 with an anchor 550. A ring resonator 530 is evanescently coupled to the tether 420. The ring resonator 530 also includes a phase tuner 535 to adjust (e.g., add or decrease) the phase delay of light propagating in the ring resonator 530. A laser 570 is employed as the light source to provide light beam for acceleration detection. The light beam delivered by the laser 570 is transmitted through an input coupler 542a, which splits the light beam into two parts. The first part is transmitted to the ring resonator 530 via a waveguide evanescently coupled to the ring resonator 530. Possible residual light that is not coupled into the ring resonator 530 is sent to a detector 545. The first part of the light beam propagating in the ring resonator 530 is coupled out by another waveguide and transmitted to an output coupler 542b. The second part of the light beam produced by the input coupler 542a is directly sent to the output coupler 542b, which combines the first part and second part of the light beam and deliver them into two detectors 544a and 544b. The circuit 400 also includes a loop filter 580 to maintain the phase matching between the oscillator 585 for the two detectors 544a and 544b and the input phase into the ring resonator 530.

Figure 5:
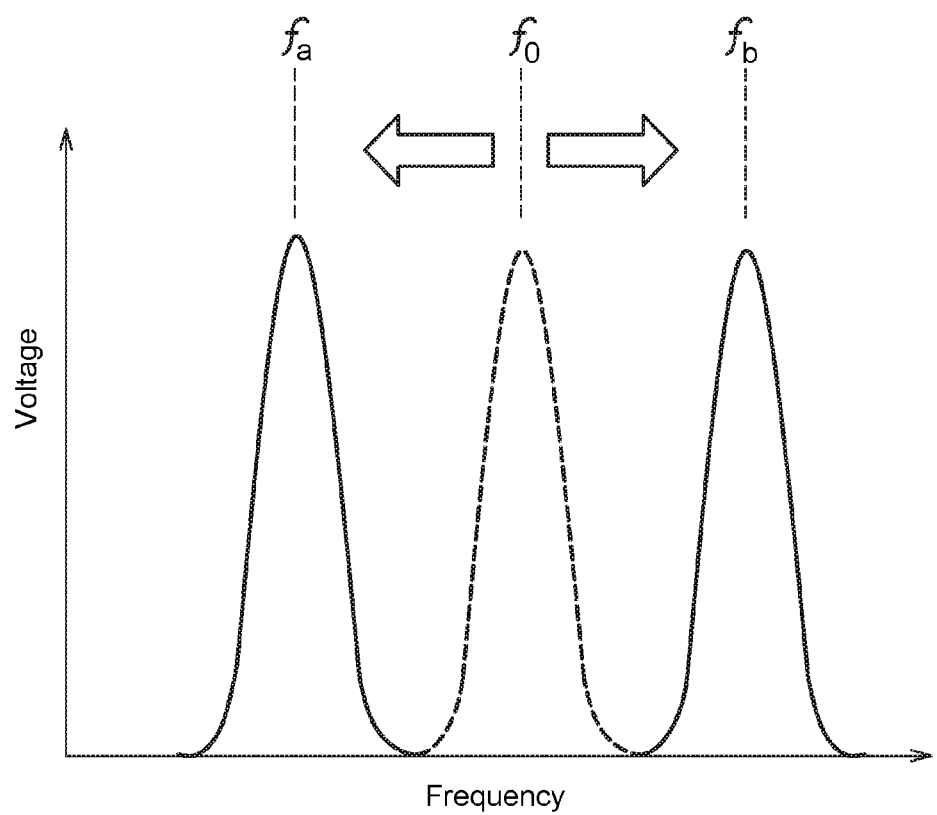
FIG. 5 shows an example frequency spectrum detected by the accelerometer 400 shown in FIGS. 4A-4B to illustrate one mechanism of acceleration detection.

FIG. 5 illustrates a frequency spectrum detected by the two frequency detectors 446a and 446b to illustrate a method of sensing acceleration using the accelerometer 400 shown in FIGS. 4A-4B. The spectrum includes a natural frequency of the tethers $f_0$ (the two tethers 420 have the same natural frequency in this case). Under the acceleration and/or other forces such as thermal expansion, the first tether 420a has a first detected frequency $f_a$ and the second tether 420b has a second detected frequency $f_b$. Any acceleration experienced by the proof mass 410 in the desired dimension act equally on both tethers 420a and 420b but with opposite force, in which case $f_a$ and $f_b$ are on different sides of the natural frequency $f_0$. In contrast, any mutual shift in the tether frequencies (e.g., $f_a$ and $f_b$ on the same side of the natural frequency $f_0$) can be attributed to either temperature fluctuations or displacement of the proof mass 410 in an orthogonal dimension.

Characterization and Analysis of PIRAs Using Ring Resonators

Proof Mass and Tether Mechanical System

The performance of a resonant accelerometer can be described by the mechanics of the proof mass and tether system. The vibration frequency (f) of the tether, as a function of the applied acceleration (a), can be expressed as:

$$f = \frac{i^2\pi}{2l^2}\sqrt{\frac{EI}{\rho wh}}\sqrt{1 \pm \frac{M_p l^2}{i^2 EI\pi^2}a + \frac{Sl^2}{i^2 EI\pi^2}} \quad (1)$$

where l, w, h are the length, width, and height of the tether, I is the moment of inertia for the vibrational mode, E and $\rho$ are the Young's modulus and density of the tether material, i is an integer mode index, and $M_p$ is the mass of the proof mass. S is an extra force component. For example, tethers made of silicon nitride can have additional internal tensile stress that is accumulated during material deposition.

Figure 6A:
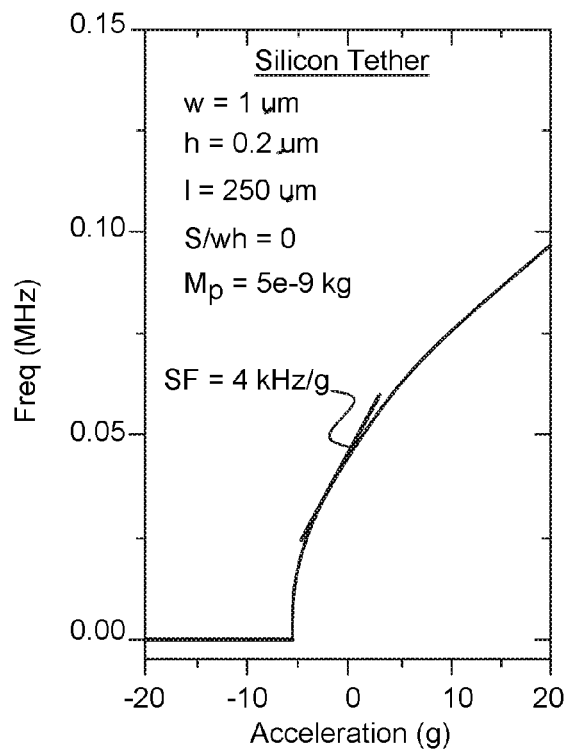
FIGS. 6A-6B show vibration frequencies of silicon and silicon nitride tethers, respectively, as a function of applied acceleration.
Figure 6B:
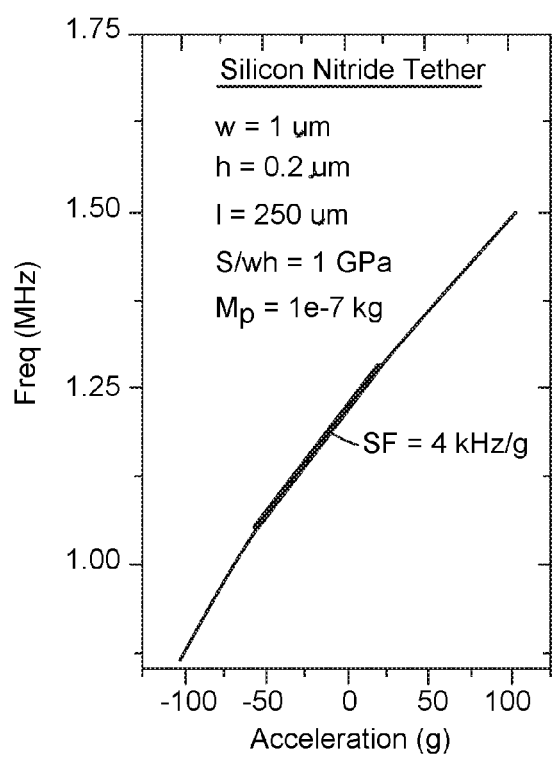

FIGS. 6A-6B show vibration frequencies of silicon and silicon nitride tethers, respectively, as a function of applied acceleration. The scale factor of an accelerometer, also referred to as the frequency change as a function of applied acceleration (in units of Hz/g), can be estimated by the slope of the curves shown in FIGS. 6A-6B. The minimum sensitivity of the accelerometer can be determined by the ratio of the scale factor (how much the frequency shifts as a function of acceleration) to the frequency stability of the tether resonance.

FIG. 6A shows the vibration frequencies of a tether made of single crystalline silicon without internal stress (S=0). This silicon material is similar to that used in state-of-the-art MEMS resonant accelerometers based on electrostatic comb drives. But the cross-sectional dimensions of the tether in FIG. 6A is less than 1 µm, about an order to magnitude smaller compared to tethers in conventional resonant accelerometers. The tether also has a height if about 200 nm and a length of about 250 µm. The mass of the proof mass is about $5 \times 10^{-9}$ kg. The scale factor for this device is about 4 kHz/g. For comparison, state-of-the-art MEMS resonant accelerometers typically have cross-sectional dimensions larger than 10 µm and scale factors in the range of about 0.1-0.2 kHz/g.

On the one hand, shrinking the size of the tether can increase the sensitivity by over an order of magnitude as seen in FIG. 6A. On the other hand, however, smaller dimensions of the tether may also cause the behavior of the tether to be non-linear and limit the dynamic range of the resulting accelerometer. Smaller sizes may also cause the tether to buckle under strong compression with only (e.g., ~6 g of inertial force according to Equation (1) when the value under the second square root becomes negative). This issue can be addressed by using materials with high tensile stress (e.g., silicon nitride) and/or increasing the size of the proof mass.

FIG. 6B shows a plot of vibration frequencies of a silicon nitride tether with the same geometric dimensions as the silicon tether shown in FIG. 6A but with an internal tensile stress approaching 1 GPa. This level of tensile stress can be obtained by depositing stoichiometric silicon nitride using low pressure chemical vapor deposition (LPCVD). By altering these mechanical characteristics (e.g., tensile stress), the high scale factor is maintained while the linearity and dynamic range are improved dramatically. The analytical expression in Equation (1) can describe the mechanical resonance frequency of the tether and can be used to understand the basic principles of the accelerometer and narrow down the design parameter space.

Figure 7A:
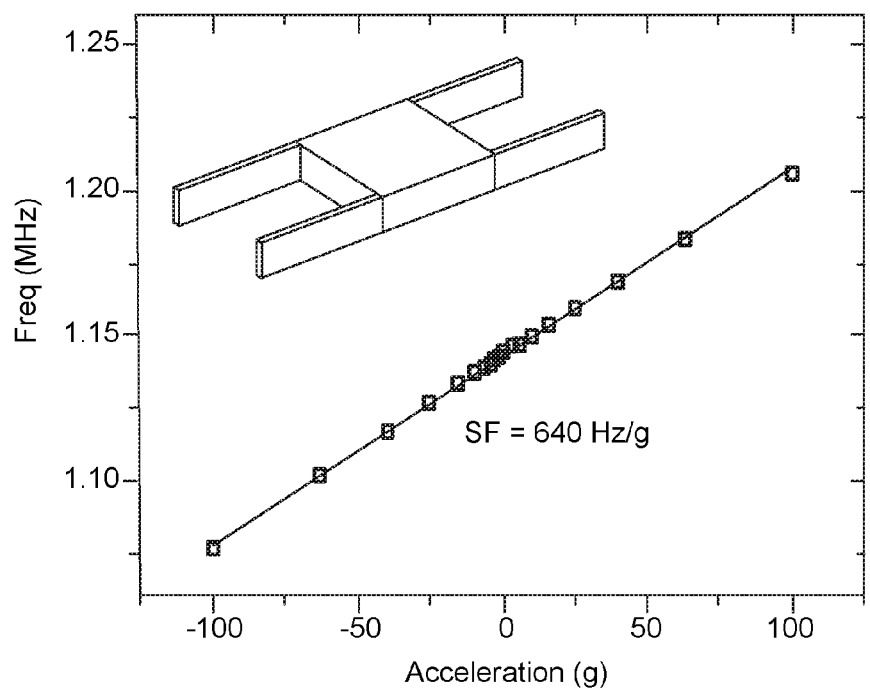
FIGS. 7A-7B show COMSOL simulations of a proof mass and tether system having a smaller proof mass and long tethers.
Figure 7B:
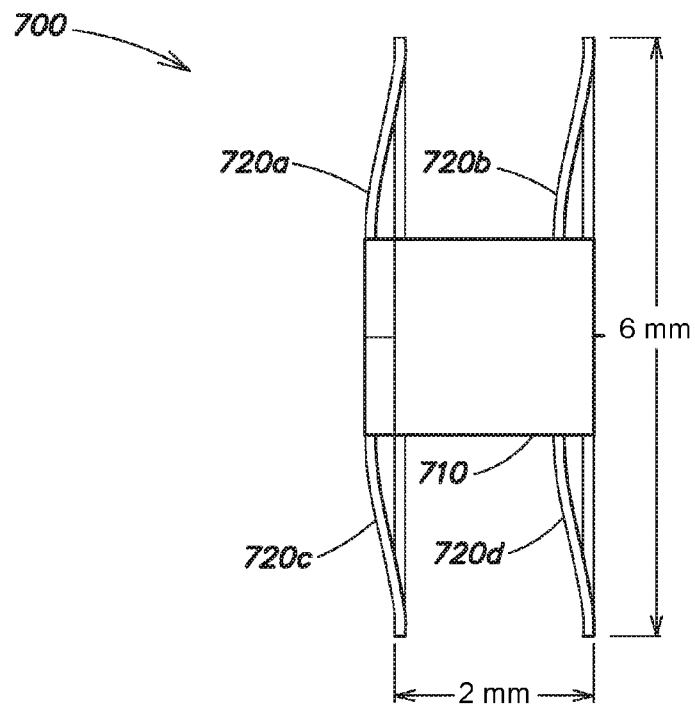

FIGS. 7A-7B show COMSOL simulations of a proof mass and tether system 700, which includes a proof mass 710 with lateral dimensions of 2 mm×2 mm and a thickness of 600 µm. Each of the four long flexures 720a, 720b, 720c, and 720d (collectively referred to as flexures 720), which function as tethers, is 2 mm long and 100 µm wide. In practice, the system 700 can be fabricated without deep Si etching and can allow the utilization of almost the entire thickness of the wafer as a proof mass.

FIG. 7A shows the simulated tether frequency as a function of acceleration. The solid line is a linear fit to the simulated data points, demonstrating a scale factor of 640 Hz/g with impressive linearity and an operating range of over 100 g. The scale factor is about three times larger than previously demonstrated resonant accelerometers.

FIG. 7B illustrates (not to scale) the lateral motion of the flexures 720 under acceleration. The resonant frequency ($\omega$) of the fundamental lateral mode is about 14 kHz. At this resonant frequency of the tether, the lateral displacement (x) under a high load (a) can be estimated using $a=\omega^2 x$ ($x \sim a/\omega^2$). For example, under a 20,000 g load, the lateral displacement x is about 26 µm. Typically, this displacement does not cause significant stress issues on the large silicon flexures, but may induce a large strain in the silicon nitride nano-mechanical tether. In general, silicon nitride thin films can withstand axial strain levels of up to 3% of the lateral dimension of the films without fracture. For a 250 µm long tether, this displacement gives a maximum of about 7.5 µm (corresponding to about 6000 g of load).

At least two approaches can be employed to address the potential strain issues in tethers. In one example, a shock stop (e.g., see FIGS. 11A-11L) can be included in the fabrication of the accelerometer with a gap less than the maximum displacement of the tether (e.g., 7.5 µm in the example above) to prevent the tether from breaking.

In another example, the length of the tethers can be decreased so as to achieve a stiffer mechanical mode, which has a higher resonant frequency and smaller displacement under a given load. For example, doubling the resonant frequency can decrease the experienced strain down to 2.5% of the lateral dimension of the tether at 20,000 g, which is within the strain limits of silicon nitride tethers. Additional parasitic mechanical modes of the tether usually occur at frequencies greater than four times of the frequency of the fundamental lateral mode, leading to displacements that can be easily tolerated by both the silicon flexures and silicon nitride tethers under a 20,000 g load.

Figure 8A:
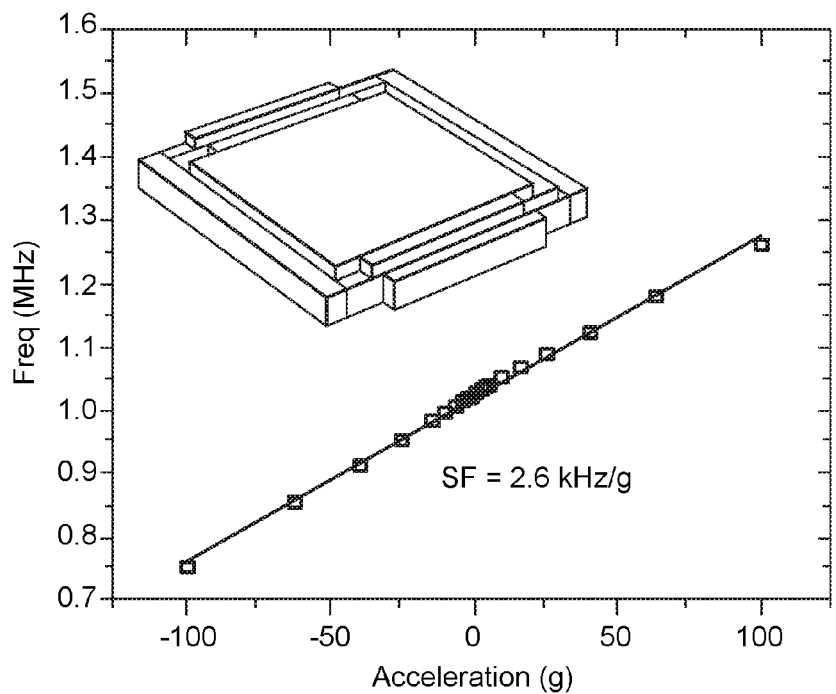
FIGS. 8A-8B show COMSOL simulations of another proof mass and tether system having a larger proof mass and shorter tethers compared to the system shown in FIGS. 7A-7B.
Figure 8B:
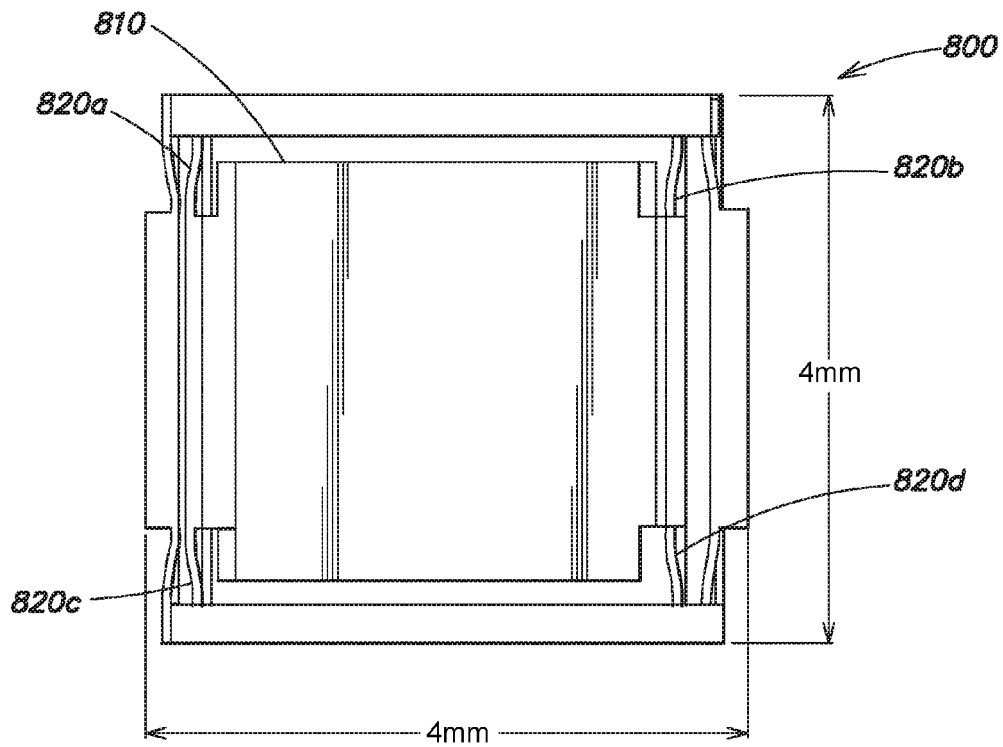

FIGS. 8A-8B show COMSOL simulations of a proof mass and tether system 800, in which the proof mass 810 has a dimension of 4 mm×4 mm and the flexures 820a, 820b, 820c, and 820d are designed to optimize the motion in the desired dimension of operation. Although the design is more complex than the system 700 shown in FIGS. 7A-7B, the minimum feature sizes for both devices are in fact identical, allowing the two structures to be made in the same fabrication run.

FIG. 8A shows the simulation results, illustrating the scale factor improvement resulting from the larger proof mass. The scale factor shown in FIG. 8A is at least ten times larger than that in current state-of-the-art resonating accelerometers, while still maintaining nearly linear operation over a wide acceleration range. Additionally, the added mass can reduce the noise equivalent acceleration of the device to below 100 ng.

Opto-mechanical Transduction System

The opto-mechanical transduction system in a PIRA detects the vibration frequencies of the nanoscale tethers. The opto-mechanical transduction system can include an integrated optical transducer which utilizes evanescent interactions from a travelling waveguide to actuate and detect the motion of a nearby suspended mechanical object. A silicon photonic ring resonator can be fabricated with a small silicon nitride tether hovering at a distance slightly above the waveguide and separated by a small air gap (e.g., <1 μm). The circuit can be excited at a wavelength near one of its optical resonances (e.g., as shown in FIG. 3), and small displacements in the tether can perturb the refractive index in the underlying optical mode such that the resonance condition undergoes a slight shift. This shift results in a change in the transmitted optical power which can be measured on a photodiode. Using this detection technique, the natural resonant frequency of the mechanical tether can be identified, and any acceleration experienced by the larger proof mass can cause the tension in the tether to change and can be detected through the altered resonant frequency.

One factor affecting the sensitivity of a PIRA is the linewidth, or frequency noise, of the mechanical vibration of the tether. To reduce this linewidth, an opto-mechanical oscillator (OMO) can be constructed, in which the optical dipole force of the light (also referred to as optical pressure, radiation pressure, or light force) acting on the tether combined with the optical resonance can form a positive feedback mechanism for mechanical motion. This can be utilized to attain self-sustained, narrow linewidth resonances in the mechanical structure, in a manner similar to quartz crystal oscillators using electronic feedback circuitry to achieve narrow radio frequency (RF) tones.

In an OMO, when the level of direct current (DC) optical power entering the optical resonator exceeds a specific threshold ($P_{th}$), the light can force the tether to enter into continuous resonant motion with very large amplitude and very low dissipation. Stable, low dissipation (high Q factor) tether resonances can in turn increase the overall acceleration sensitivity of the device.

Factors that can affect the operation of the OMO in a PIRA include the threshold power, at which oscillation begins ($P_{th}$), and the phase noise spectrum of the oscillator, which describes the frequency stability of the tether vibration and relates to the resolution of the accelerometer.

The threshold power of an OMO having a geometry similar to the one shown in FIG. 2A, where an optical resonator resides in close physical proximity to a tangential nano-mechanical resonator, can be estimated as:

$$P_{th} = \frac{\omega_o^4}{4} \frac{m_{eff} \Omega_m}{Q_o^3 Q_m g_{om}^2} \left(1 + 4 \frac{\Omega_m^4 Q_o^4}{\omega_o^4}\right) \quad (2)$$

where $\omega_o$ and $\Omega_m$ are the optical and mechanical resonance frequencies, $Q_o$ and $Q_m$ are the optical and mechanical quality factors, $m_{eff}$ is the effective mass of the mechanical resonator and $g_{om}$ is the opto-mechanical coupling strength.

In one example (e.g., the OMO shown in FIG. 2A), the mechanical quality factor $Q_m$ can be about 1×10⁶, the optical quality factor of the ring resonator $Q_o$ can be about 5×10⁴, and the opto-mechanical coupling strength $g_{om}$ can be about 1 GHz/nm. Under this condition, the threshold optical power $P_{th}$ is about 0.27 mW. The threshold power can be reduced by increasing the quality factors $Q_o$ and $Q_m$ and the coupling strength $g_{om}$. Optical quality factors $Q_o$ in the range of 10⁴ and 10⁵ are readily achievable in standard silicon photonic ring resonators. Large mechanical quality factors $Q_m$ can be achieved using the tensile strain in the silicon nitride tethers, which can provide quality factors exceeding 10⁶. Strong coupling strength $g_{om}$ can be achieved by careful design of the optical waveguide and silicon nitride tether such that interaction between the two is maximized. In one example, the interaction can be increased by reducing the distance between the ring resonator and the tether. In another example, the interaction can be increased by increasing the interaction length between the ring resonator and the tether. For example, a racetrack shaped resonator can be used, with one of the straightaways directly underneath the tether. In this case, the interaction (coupling strength) between the tether and the resonator can be increased. Although a large optical quality factor can reduce the threshold power $P_{th}$ to reach opto-mechanical oscillation, it may also negatively impact the phase noise of the OMO. In practice, it can be helpful to keep the optical quality factor at a low level as long as the threshold power is reached.

Figure 9:
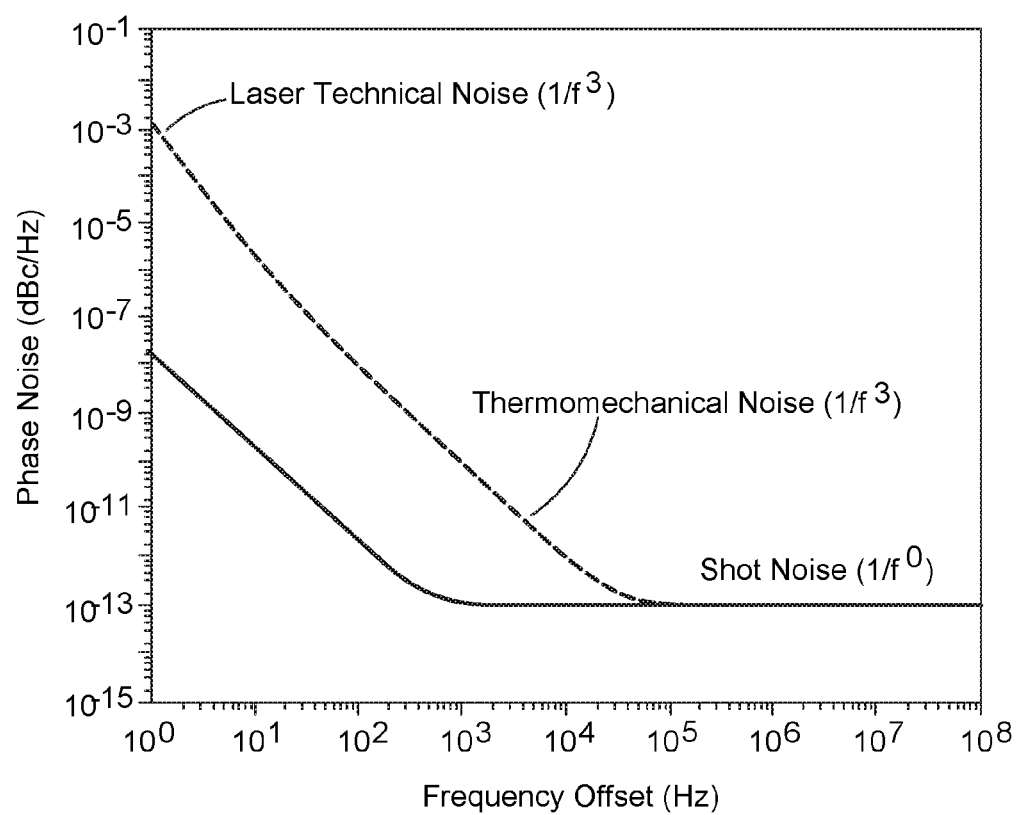
FIG. 9 shows phase noise spectra of conventional opto-mechanical oscillators (OMOs) and the OMO shown in FIG. 2A.

FIG. 9 shows phase noise spectra of conventional OMOs and the OMO shown in FIG. 2A by taking into account the different optical and mechanical parameters involved in the system. The top curve in FIG. 9A shows an example phase noise spectrum (black curve) that represents state-of-the-art phase noise performance from an opto-mechanical oscillator and identifies the various contributing factors into this noise spectrum. The phase noise of the OMO shown in FIG. 2A is represented by the lower curve in FIG. 9, which illustrates decreased phase noise, especially in the lower-frequency range. The improvements of phase noise performance in the OMO described herein can be attributed to a few particular parameters, including the reduced mechanical resonance frequency and the increased mechanical quality factor, which can suppress both the thermomechanical noise of the resonator as well as technical laser noise contributions (both phase noise and relative intensity noise) from the input source.

Based on the phase noise performance shown in FIG. 9, the bias stability of the OMO can be estimated by converting the phase noise spectrum ($\mathcal{L}(\omega)$) to Allan variance ($\sigma$) and the frequency stability ($\Delta f$) can be calculated by:

$$\sigma(\tau) = \frac{\Delta f}{f} = \sqrt{\int_0^\infty \frac{4\omega^2 \mathcal{L}}{\omega_0^2} \frac{\sin^4(\omega\tau/2)}{\left(\frac{\omega\tau}{2}\right)^2} \frac{\partial \omega}{2\pi}} \quad (3)$$

The frequency stability can then be divided by the scale factor (SF=2.6 kHz/g) previously calculated (see, e.g., FIGS. 6A-8B and the relevant descriptions) to obtain bias stability.

Figure 10A:
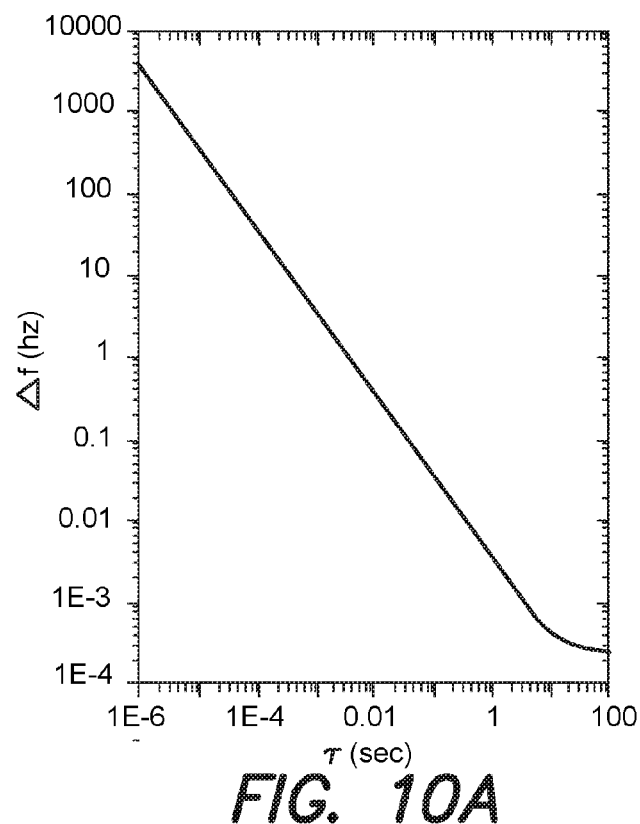
FIGS. 10A-10B are simulation results of frequency stability and bias stability of the OMO shown in FIG. 2A.
Figure 10B:
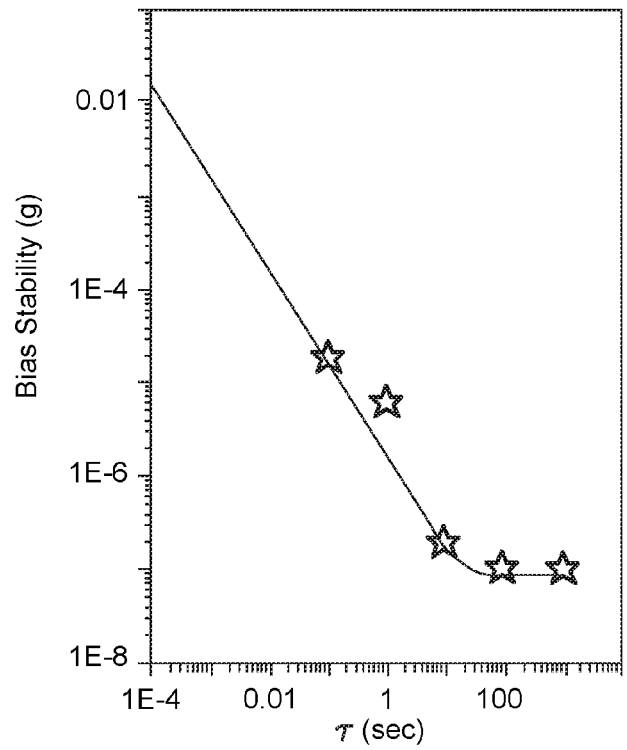

FIGS. 10A-10B show the frequency stability $\Delta f$ and the corresponding bias stability calculated using the phase noise plot in FIG. 9. The simulations described above illustrate that the OMO described herein is capable of measuring accelerations down to the 100 ng level with a nearly linear dynamic range greater than 100 g. This represents a dynamic range of about 10⁹, which significantly exceeds the dynamic range of the current state of the art technologies.

Accelerometer Stability/Repeatability

In the PIRAs described herein, although optical transduction is employed to achieve high sensitivity, the bias and scale factor stability typically do not directly depend on the incident optical wavelength. The optics are used to detect the tether resonance frequency, and it is this mechanical property that primarily governs both the bias stability and scale factor of the accelerometer. The mechanical properties of the accelerometer can in turn depend on the temperature of the nano-mechanical tether, because any change in temperature can cause a change of the Young's modulus (E) of the tether material. According to Equation (1), any change in Young's modulus can cause a shift of vibration frequency in the tether, which can be read out as a bias drift. Additionally, the scale factor, which can be defined as the derivative of Equation (1) with respect to acceleration a, is also dependent on E and can undergo a shift with temperature as well. As a result, it can be beneficial to compensate for these thermal shifts so as to maintain the bias and scale factor stability at parts per million (ppm) levels.

In one example, long-term bias drift due to temperature can be compensated for by monitoring the frequency shift of both tethers collectively (see, e.g., FIGS. 4A-4B). Any acceleration experienced by the proof mass in the desired dimension usually acts equally on both tethers but with opposite force. As a result, any mutual shift in the tether frequencies can be attributed to either temperature fluctuations, or, to a much lesser degree, on proof mass displacement in an orthogonal dimension.

In another example, additional OMOs (e.g., silicon nitride OMOs) can be placed on the chip to further reduce tether frequency shift due to temperature changes in the material. The additional OMOs can be separated from the proof mass such that they are not affected by motion of the proof mass and only change the vibration frequency as a result of temperature fluctuation. Each additional OMO may take less than 1 mW of optical power for operation, allowing multiple OMOs to be used for temperature calibration without significantly impacting the overall power budget. In one example, the additional OMO can be identical to FIG. 2A but without one of the tether ends fixed to a proof mass. The addition OMO can also be placed anywhere on the chip.

In yet another example, an insulating material can be applied to the tethers to protect the tethers from temperature changes in the surrounding environment. The tethers can be made of highly stressed silicon nitride, so they can sustain high packaging stresses without suffering frequency shifts when insulating materials are applied.

In yet another example, an active temperature control can be employed to keep the tether at a constant temperature. The small volume of the individual tethers allows for their frequencies to be independently adjusted using nearby resistive heaters, which require very little power. COMSOL simulations of the PIRAs described herein suggest that it may take only 30 mW of dropped power into one resistive heater placed near the clamping base of the tether to bring the temperature of a single tether from −54° C. up to over 85° C. The active temperature control can be implemented in a similar manner as implemented for oven controlled crystal oscillators (OCXO).

In yet another example, a stable long-term reference oscillator can be included in the PIRA to improve bias stability. The frequency of the tether can be periodically referenced to the stable RF tone of the reference oscillator, and any drift in the tether frequency at these long time scales can be compensated for before measurements are made. Examples of reference oscillators include temperature-compensated crystal oscillators (TCXOs), oven-controlled crystal oscillators (OCXOs), and chip scale atomic clocks (CSACs), among others.

Silicon Photonic Integrated Circuit

One benefit of the PIRAs described herein is that the mechanical sensing structure seamlessly integrates with a standard silicon photonic platform. The opto-mechanical transduction utilizes a silicon photonic ring resonator which can reside on a different plane than the mechanical tether (e.g., the ring resonator and the tether are vertically separated, as in FIG. 2B). This allows for the simultaneous fabrication of a multitude of other silicon photonic components alongside the opto-mechanical system. These components can be used to process the optical signal and stabilize the optical resonator. These optical circuit components include grating couplers for coupling light on/off chip, phase tuners for active control of the ring resonator, and integrated photodiodes.

The combination of integrated photodetectors and phase tuners on-chip can be used to construct a balanced homodyne feedback circuit to maintain stable performances of the ring resonators over temperature by preserving a desired phase in the ring resonator such that the input laser wavelength always rests at the point of maximum slope (see, e.g., FIG. 3). In this case, unwanted thermal drift can be prevented from impacting the optical signal-to-noise ratio. More information of balanced homodyne feedback circuit can be found in Cox, Jonathan A., et al.,"Control of integrated micro-resonator wavelength via balanced homodyne locking," *Opt. Express* 22.9 (2014): 11279-11289, which is incorporated herein in its entirety.

Electronic Signal Processing Circuitry

The signal processing circuitry in a PIRA demodulates the acceleration signal. In one example, rack-mounted analog RF signal processing equipment can be used to demodulate the acceleration signal. An electronic spectrum analyzer can be used to measure phase noise of the OMO, as well as the frequency content of specified inertial input. Frequency counters can also be used to demodulate the resonant frequency of a particular OMO and translate any frequency shift to inertial input. Circuits of additional complexity can also be used to convert the frequency output to a digital signal directly. In resonant accelerometers, chip-scale demodulation techniques can leverage much of the infrastructure and expertise developed for RF communications applications. In this example, signal processing requirements can be determined by digitizing the photodetector signals and utilizing commercial signal processing simulation tools (e.g., MATLAB). The results from these simulations will help guide the design and construction for the electronic circuit. In another example, various bonding techniques (e.g., wire-bond, flip-chip, wafer bonding, etc.) can be employed to bond the electronic circuitry to the photonic chip.

Methods of Fabricating PIRAs Including Ring Resonators

Figure 11A:
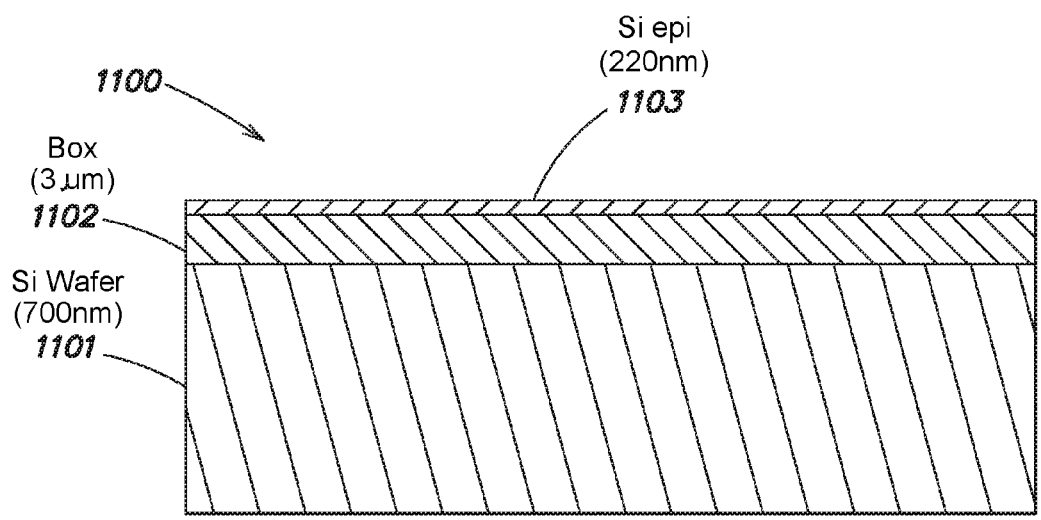
FIGS. 11A-11L illustrate a method of fabrication photonic integrated resonant accelerometers including ring resonators.
Figure 11B:
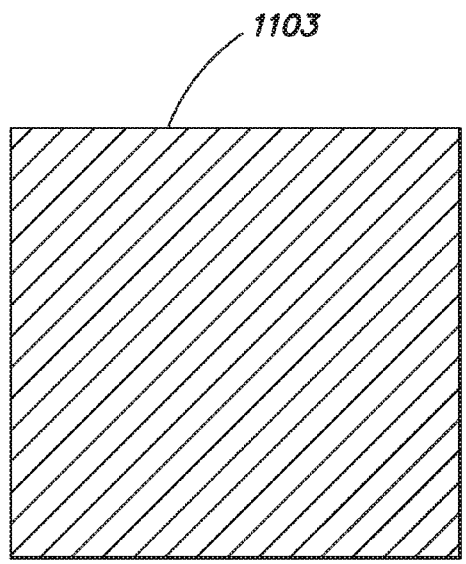

FIGS. 11A-11L illustrate a method 1100 of fabricating PIRAs using ring resonators to measure the tether frequencies. The method 1100 begins with a standard silicon-on-insulator (SOI) wafer including an insulator layer 1102 disposed on a silicon base layer 1101. A device layer 1103 is disposed on the insulator layer 1102, as shown in FIG. 11A (cross sectional view) and FIG. 11B (top view). The device layer 1103 can include dielectric materials such as silicon. The thickness of the device layer 1103 can depend on the desired height of the resulting photonic circuit components such as ring resonators and waveguides. In one example, the thickness of the device layer 1103 can be about 100 nm to about 500 nm (e.g., 50 nm, 100 nm, 200 nm, 300 nm, or 500 nm).

Figure 11C:
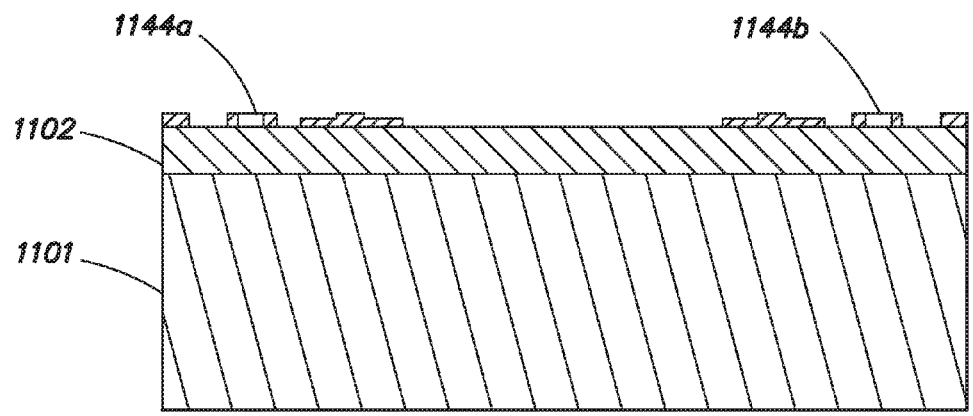
Figure 11D:
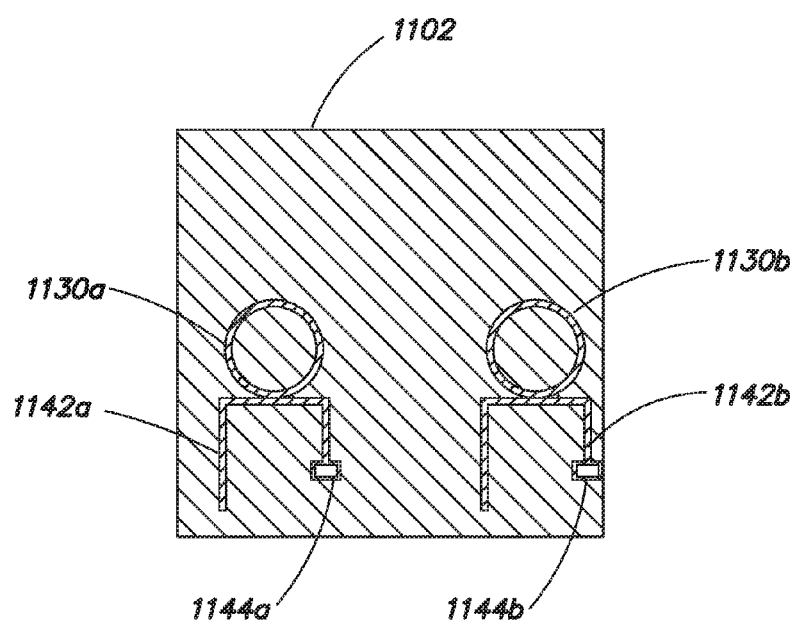

FIGS. 11C-11D illustrate the steps of the method 1100 in which silicon photonic integrated circuit is defined in the device layer 1103. The defined circuit includes a pair of ring resonators 1130a and 1130b (collectively referred to as ring resonators 1130), waveguides 1142a and 1142b that are evanescently coupled to the ring resonators 1130a and 1130b, respectively, and integrated photodetectors 1144a and 1144b, optically coupled to the waveguides 1142a and 1142b, respectively.

Figure 11E:
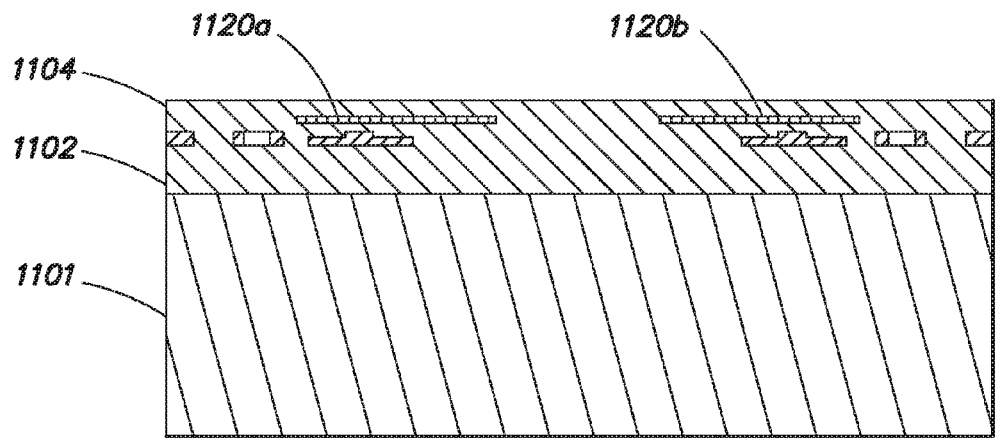
Figure 11F:
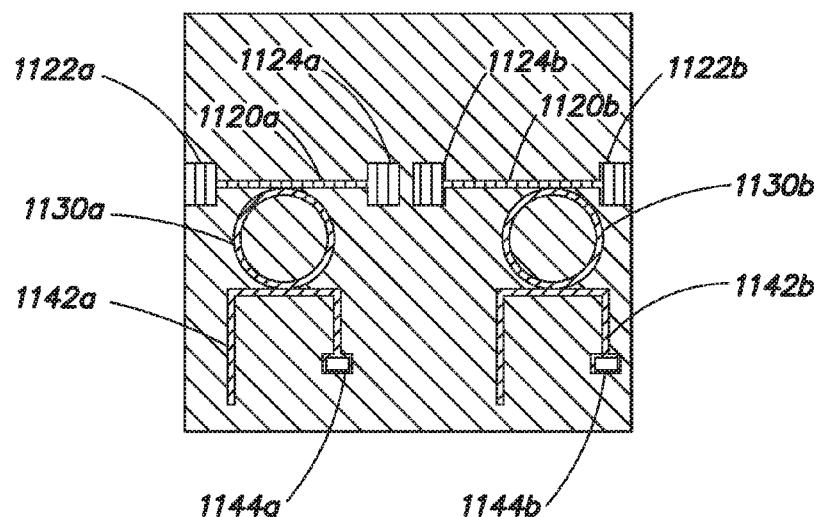

FIGS. 11E-11F illustrate the fabrication of tethers. A second dielectric layer 1104 is deposited on the ring resonators 1130, the waveguides 1142, and the photodetectors 1144 for passivating the photonic circuits. A layer of stoichiometric silicon nitride can be deposited via low pressure chemical vapor deposition (LPCVD) on the second dielectric layer 1104. Then a pair of tethers 1120a and 1120b is defined from the silicon nitride layer. This layer can be used to define the high stress silicon nitride nano-mechanical tethers. In addition, for each tether 1120a/1120b, a respective first anchor 1122a/1122b and second anchor 1124a/b are defined. The first anchor 1122a/b can be used to fix the tether 1120a/b on the substrate (e.g., 1104 or 1102) and the second anchor 1124a/b can fix the tether 1120a/b on the proof mass to be defined in subsequent steps.

Figure 11G:
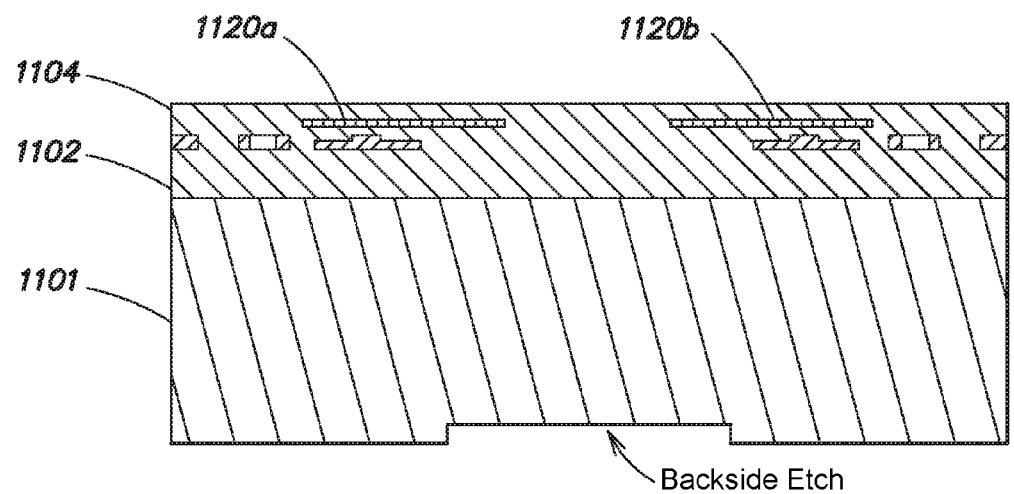
Figure 11H:
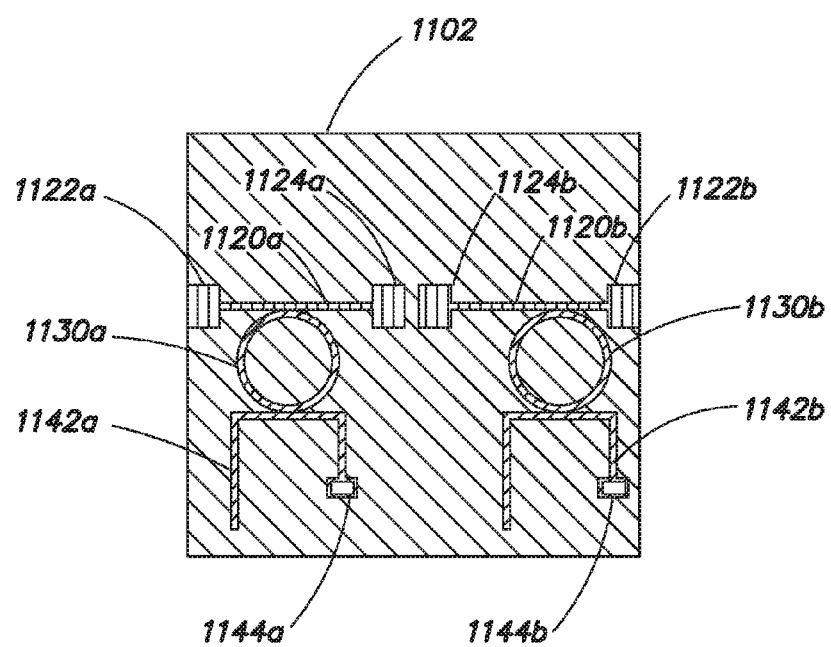

FIGS. 11G-11H illustrate a back etching step to initiate the fabrication of a proof mass. In this step, the back side of the wafer including the silicon base 1101 and the insulator layer 1102 can be etched down from the full thickness (700 µm) down to 600 µm to define the proof mass region.

Figure 11I:
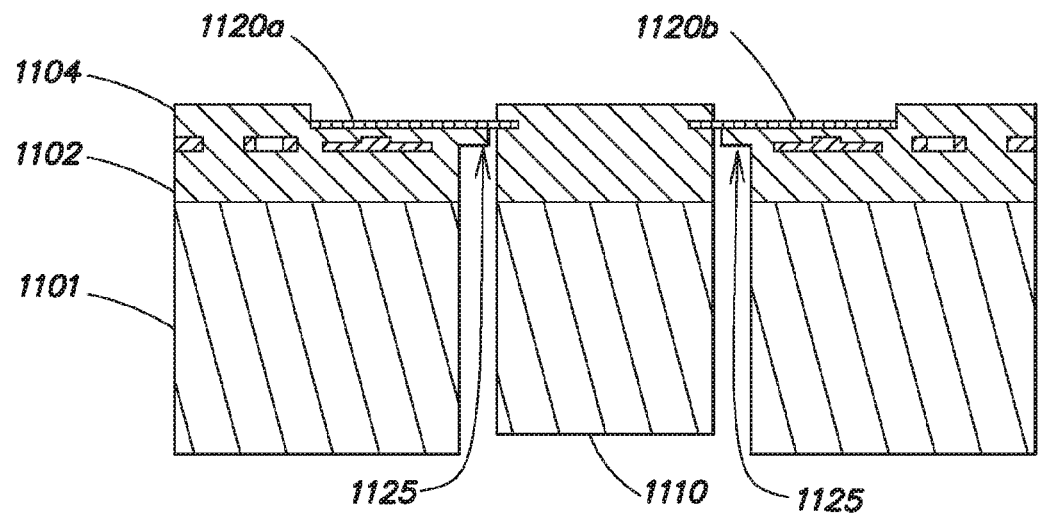
Figure 11J:
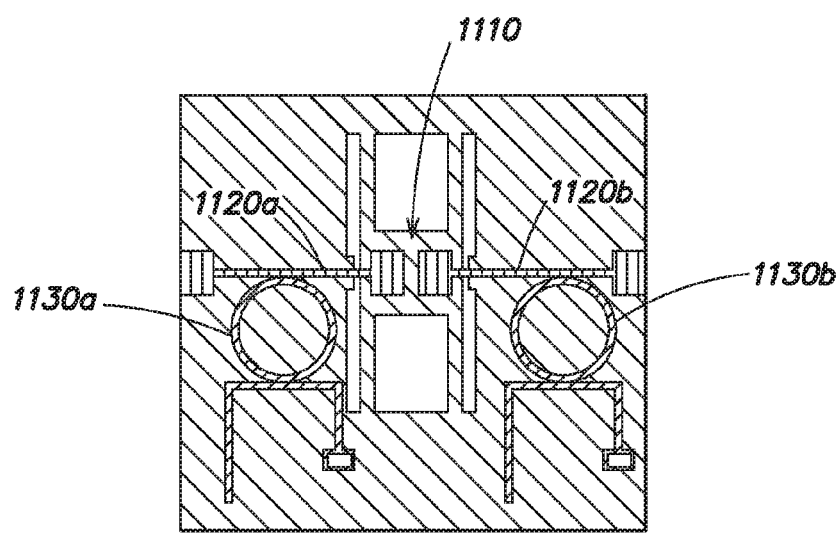

FIGS. 11I-11J show the cross sectional view and the top view, respectively, of the defined proof mass 1110 suspended by the two tethers 1120a and 1120b to the substrate. The proof mass 1110 and associated shock stops 1125 can be defined by, for example, a deep Si etch to penetrate entirely through the 600 µm thick Si wafer, followed by a small isotropic wet Si etch to remove any Si which remains underneath the tether region.

Figure 11K:
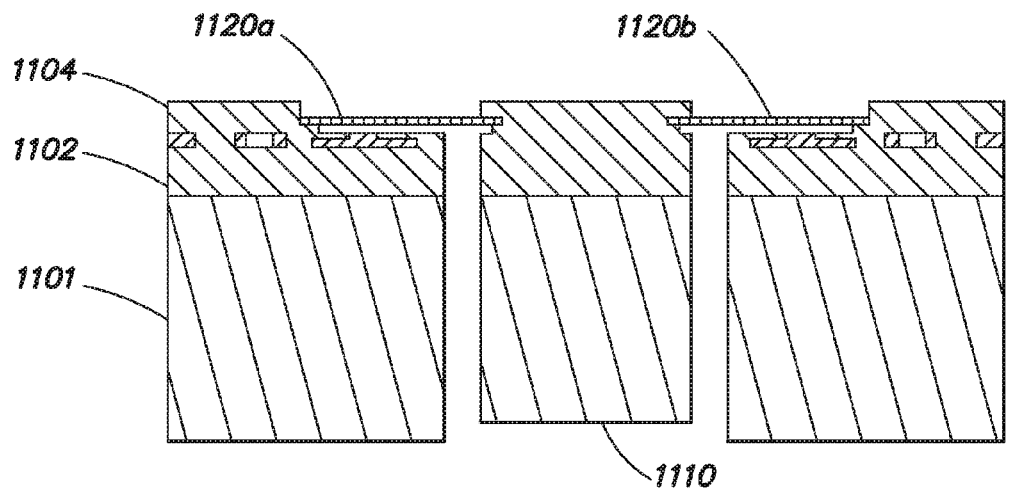
Figure 11L:
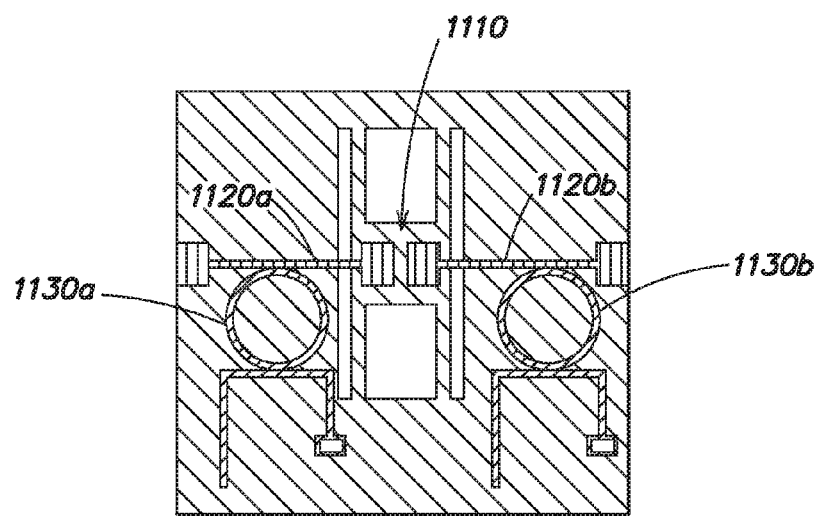

FIGS. 11K-11L illustrate the releasing of the tethers 1120a and 1120b. The releasing can be achieved by a controlled buffered HF wet etch to remove the dielectric materials underneath the tethers 1120a and 1120b so as to allow the tethers 1120a and 1120b to vibrate freely under force. The etching can be followed by a critical point drying process to reduce stiction of the tethers 1120a and 1120b to the silicon photonic circuit such as the ring resonators 1130a and 1130b. In one example, the resulting gap between the ring resonators 1130a/b and the tethers 1120a/b can about 100 nm in vertical direction.

Alternatively, the entire proof mass 1110 can also be defined and etched through the back side of the silicon base 1101. In this case, both the shock stop definition and tether release can still be accomplished on the front side of the wafer, such as the insulating layer 1102 or the second dielectric layer 1104, after the proof mass 1110 is defined. In this case, the proof mass 1110 can encompass the full thickness of the silicon wafer (without the initial etching as shown in FIG. 11G), which can be beneficial for accelerometer performance due to the added mass, but the mount for the chip may become more complex in order for the proof mass 1110 to move freely.

FIGS. 12A-12I illustrate a method 1200 of packaging a photonic integrated resonant accelerometer so as to maintain the accelerometer in a vacuum condition (e.g., at a pressure level of about $10^{-5}$-$10^{-3}$ Torr) and reduce or avoid squeeze-film damping in the nanosecond tethers and the microscale proof mass. Steps in the method 1200 can be carried out during the steps of the method 1100 illustrated in FIG. 11. The packaging can be carried out using wafer-scale encapsulation techniques, which can provide a sealed, high vacuum environment for MEMS devices. The batch process can also reduce packaging cost per device, improve yield, and allow for easier die singulation.

Figure 12A:
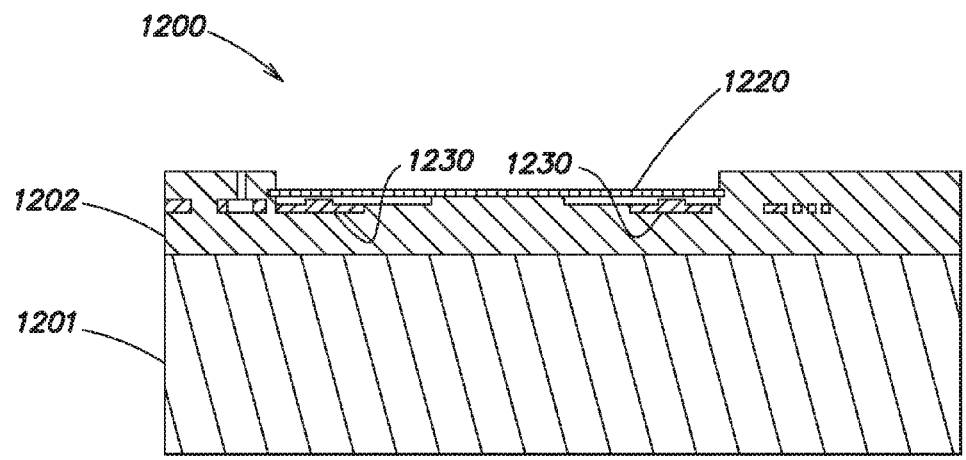
FIGS. 12A-12I illustrate a method of packaging photonic integrated resonant accelerometers.
Figure 12B:
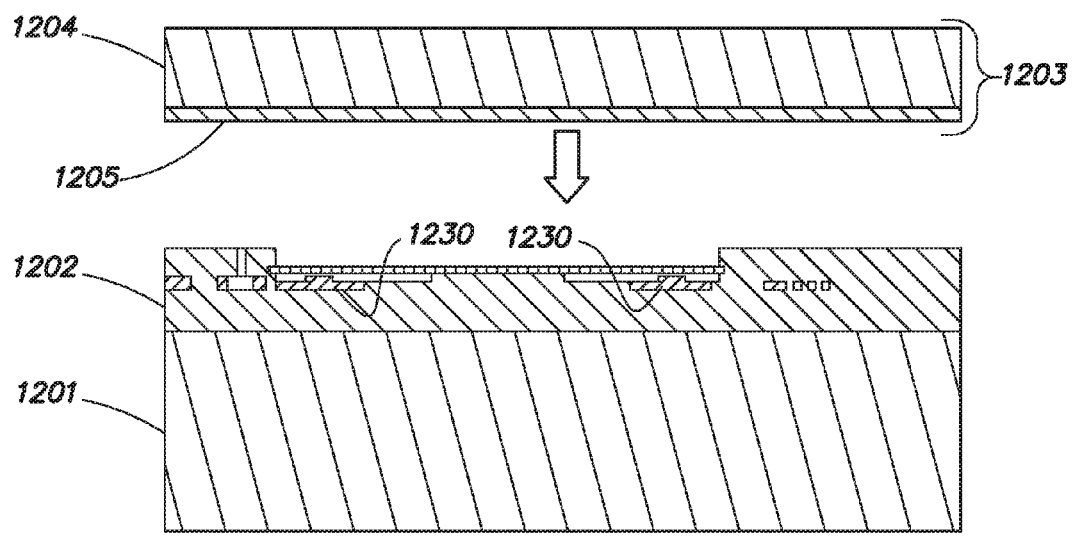
Figure 12C:
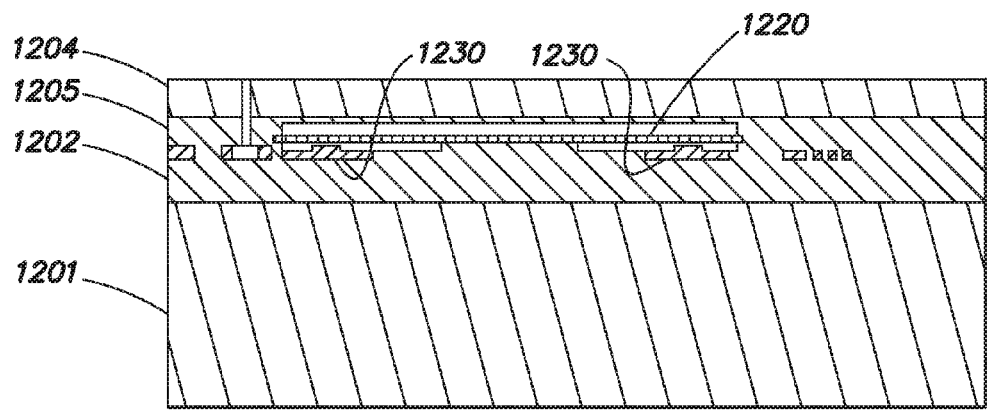

FIG. 12A shows that the method 1200 can start after the step of tether release, in which tethers 1220 are defined and released from a photonic circuit layer 1230. The photonic circuit layer 1230 can include components such as ring resonators, waveguides, and photodetectors, all of which are fabricated on a wafer including a first insulator layer 1202 disposed on a first silicon base 1201. FIG. 12B shows that after tether release, a second wafer 1203 is oxide bonded to the device shown in FIG. 12A. The second wafer 1203 can include a second insulator layer 1205 disposed on a second silicon base 1204. FIG. 12C shows the bonded device in which the photonic circuit layer 1230 and the tethers 1220 are sandwiched between two insulating layers 1202 and 1205. The second silicon base 1204 can be thinned on the top to fully enclose the tethers 1220.

Figure 12D:
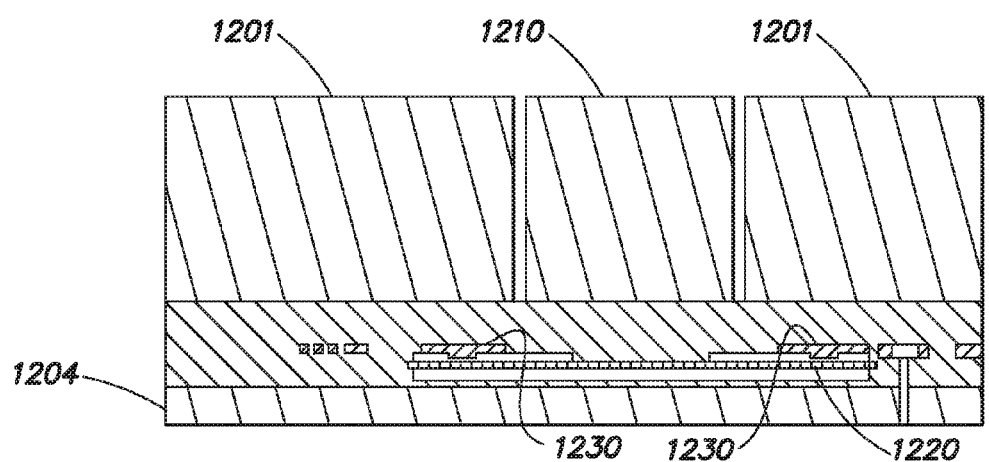
Figure 12E:
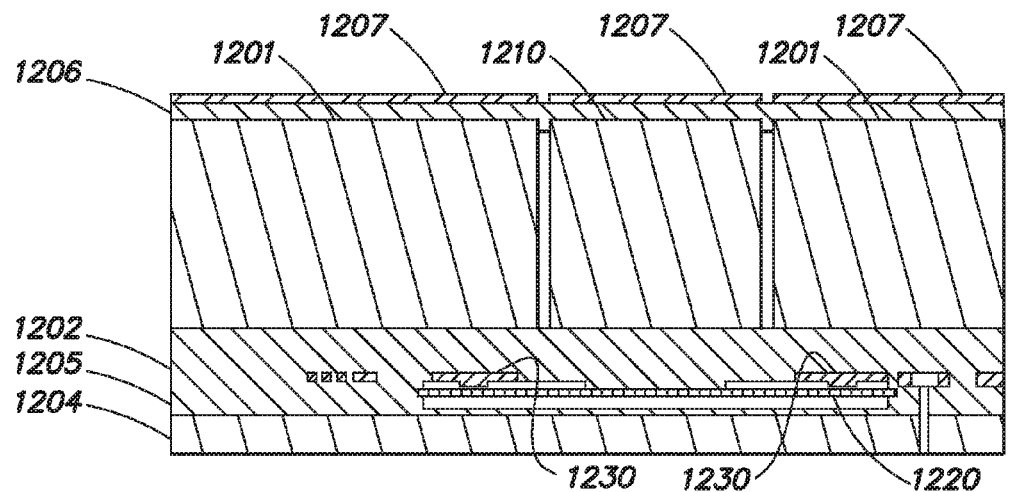

FIG. 12D shows that the bonded device is flipped over such that the first silicon base 1202 is upward for further processing. For example, the first silicon base 1202 can be thinned and etched to define a proof mass 1210 (not fully released as shown in FIG. 12D). FIG. 12E shows that the thinned first silicon base 1202 is deposited with an oxide layer 1206, on which a first epitaxial layer of poly-silicon 1207 is grown.

Figure 12F:
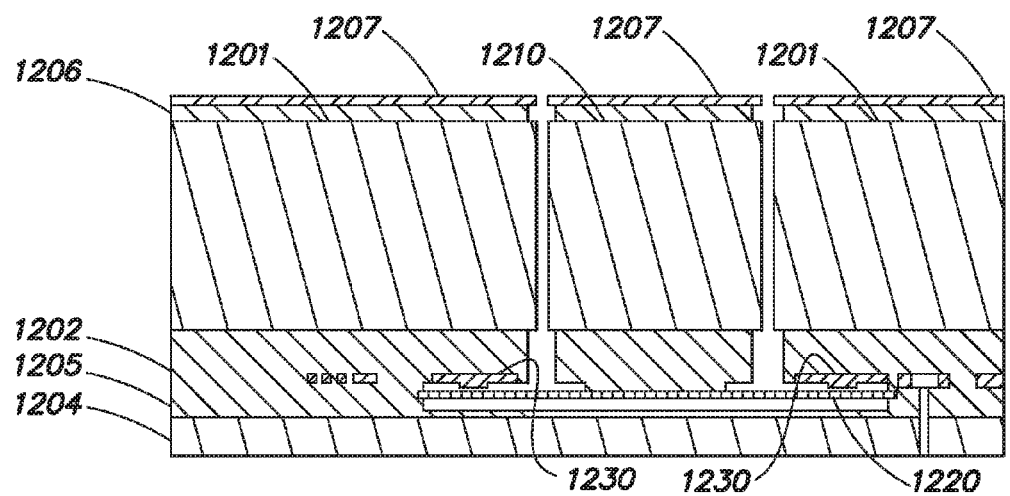
Figure 12G:
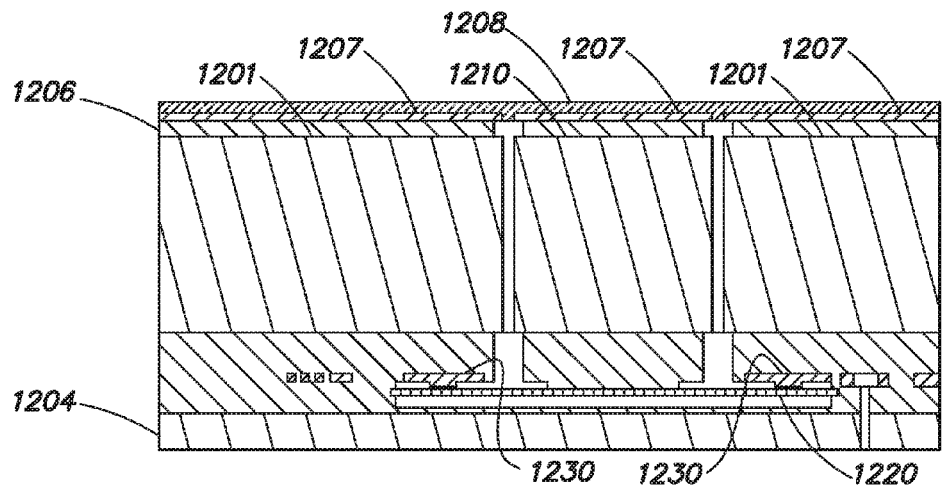

FIG. 12F illustrates the release of the proof mass 1210 via an HF vapor process, after which the proof mass 1210 is suspended to the first insulating layer 1202 via the tethers 1220. After this, a second epitaxial layer of poly-silicon 1208 is grown on the first epitaxial layer of poly-silicon 1207 as shown in FIG. 12G. The second epitaxial layer of poly-silicon 1208 can seal the fabricated components, including the proof mass 1210, the tethers 1220, and the photonic circuit layer 1230 in a vacuum condition.

Figure 12H:
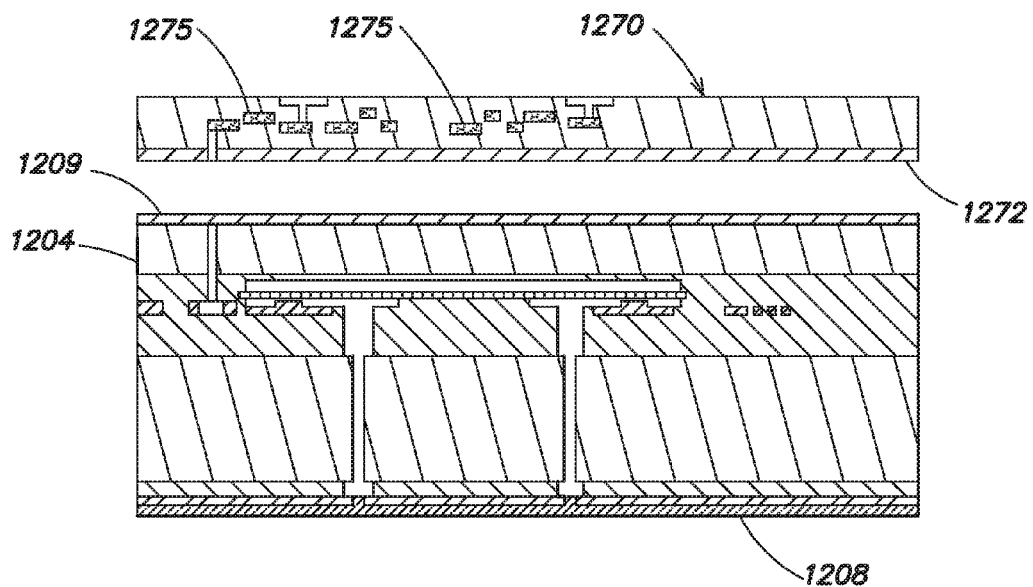

In the next step, as illustrated by FIG. 12H, the back-sealed device is flipped again such that the first silicon base 1201 is downward. An electronics layer 1270, including CMOS electronics 1275 and a first oxide layer 1272, can be wafer bonded to the second silicon base 1204 via, for example, oxide-oxide bonding techniques. To facilitate the bonding, a second oxide layer 1209 can be deposited on the second silicon base 1204 before coupling the electronics layer 1270.

Figure 12I:
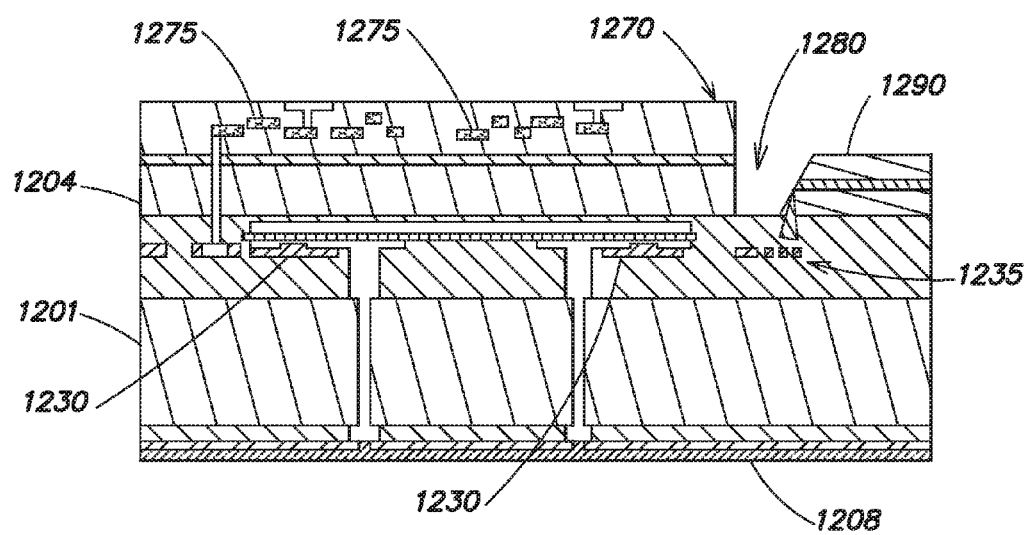

FIG. 12I shows that a deep trench 1280 can be etched into the silicon portion of the electronics layer 1270 as well as the second silicon base 1204. Thermo-compression solder bonding can be implemented using a commercial flip-chip bonding tool to direct light emitted from a light source 1290 into an entry grating coupler 1235 (part of the photonic circuit layer 1230) designed appropriately to minimize optical losses from alignment offsets. The entry grating coupler 1235 can guide the light into the rest part of the photonic circuit layer 1230 such as ring resonators. In one example, the light source 1290 includes a surface emitting laser. In another example, the light source 1290 includes an edge emitting laser. The resulting device as shown in FIG. 12I includes a complete single chip accelerometer that can operate in harsh conditions such as under high shock.

Alternatively, a commercial vacuum packaging service (e.g., SST International) can be used to provide vacuum packaging of individual die. Additionally, the individual chip packaging approach relies on wire-bonded electrical interfaces to the photonic circuit, which may not stand up to the extremely high shock requirements. The wafer-scale approach, by contrast, involves through-silicon vias and oxide bonded wafers to connect the electronic and photonic plus MEMS wafer, and can be flip-chip bonded to a printed-circuit board.

PIRAs Using A Fabry-Perot Interferometer

Other than using ring resonators, PIRAs can also use linear resonators, which include two reflectors, to detect the tether frequencies and estimate the acceleration. One reflector in the linear resonator can be fixed on a substrate while the other reflection can be attached to (e.g., disposed on or in) the tether. The motion of the proof mass can compress or stretch the tether and change the reflectivity (and/or transmission) of the reflector attached to the tether. Alternatively, the motion of the proof mass can change the location of the reflector attached to the tether and change the length of the resonator. In either case, the resonance condition of the resonator changes accordingly, which can be manifested by the change of light beam properties (e.g., power, spectrum, etc.) transmitted through or reflected by the resonator. As a result, monitoring the beam qualities propagating through or reflected by the resonator can provide information regarding the motion of the proof mass and according the acceleration on the proof mass.

Figure 13A:
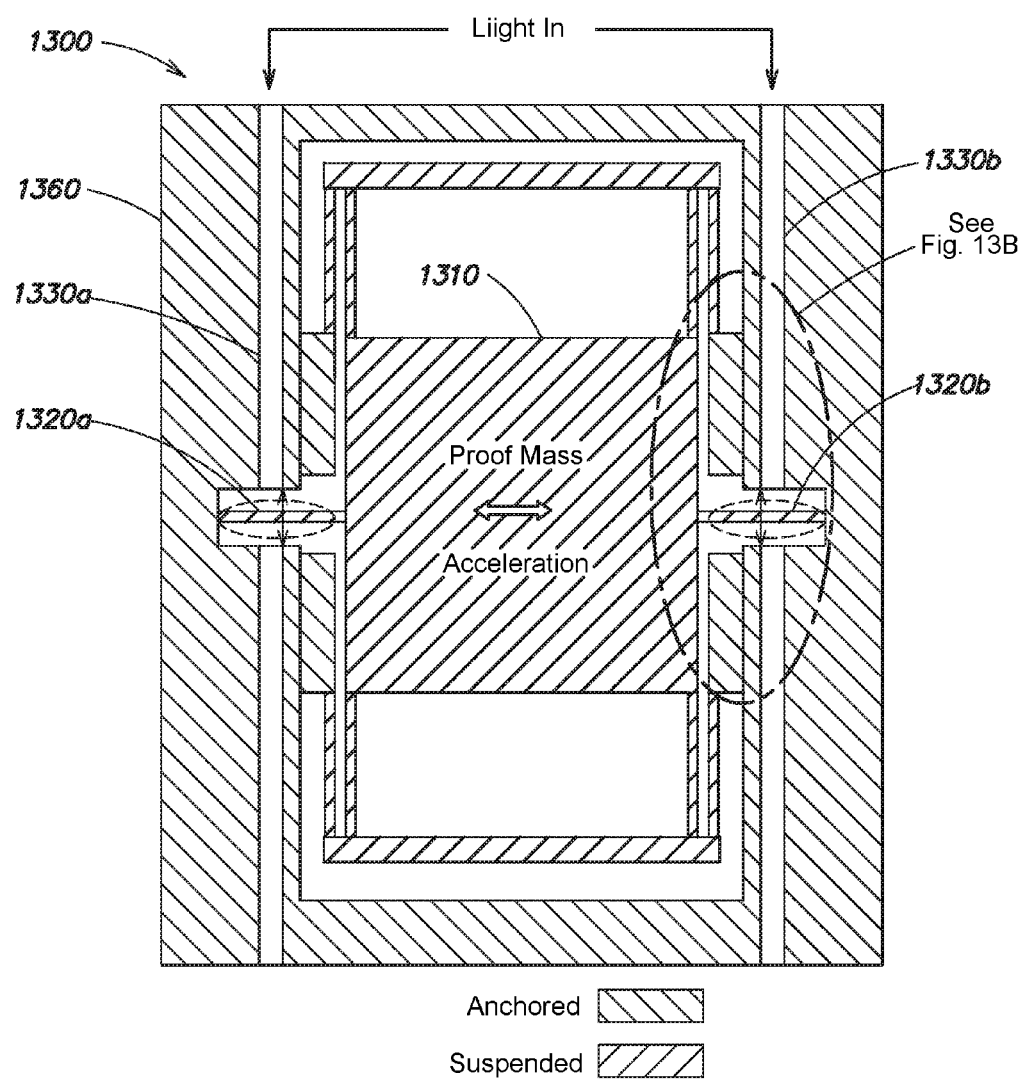
FIGS. 13A-13B show schematics of photonic integrated resonant accelerometers using linear resonators formed by distributed Bragg reflectors.
Figure 13B:
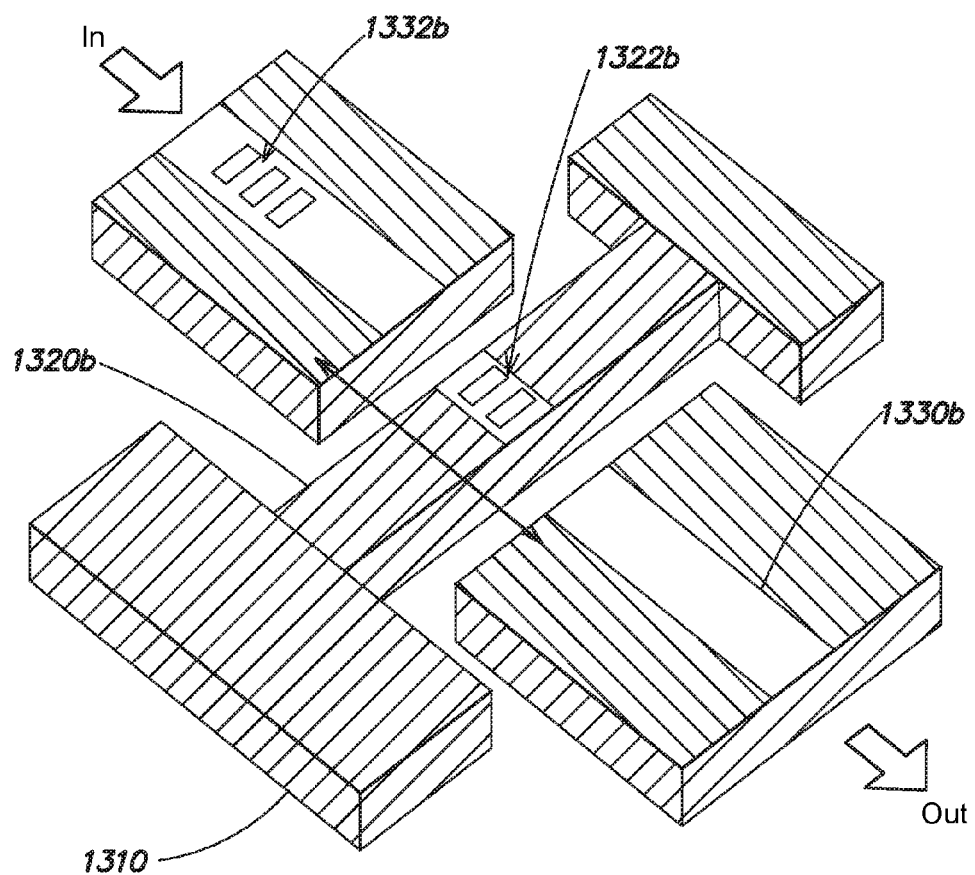

FIGS. 13A-13B shows an accelerometer 1300 including a proof mass 1310 suspended to a substrate 1360 via two tethers 1320a and 1320b. The first tether 1320a crosses a first linear waveguide 1330a such that the first tether 1320a is in the beam path of light beam propagating in the first linear waveguide 1330a. Similarly, the second tether 1320b crosses a second linear waveguide 1330b and is in the beam path of light beam propagating in the second linear waveguide 1330b. As shown by the magnified portion in FIG. 13B, the second linear waveguide 1330b includes a fixed mirror 1332b, while the second tether 1320b includes a moving mirror 1322b. The two mirrors 1332b and 1322b can form a Fabry-Perot interferometer. Similarly, the first linear waveguide 1330a and the first tether 1320a can also include mirrors (not shown) to form another Fabry-Perot interferometer. The accelerometer shown in FIGS. 13A-13B includes only two tethers 1320a and 1320b, but other designs may feature a multitude of tethers (as many as can geometrically fit in a given design) to enhance the system sensitivity or stability.

The mirrors 1332b and 1322b can be defined by etching a distributed Bragg reflector (DBR) into the linear waveguide 1330b and the tether 1320b, respectively. With one DBR mirror 1322b fabricated on the tether 1320b and free to move, and the other DBR mirror 1332b fixed onto the silicon waveguide 1330b, the tether motion changes the resonance condition of the cavity, which can be detected by setting the wavelength of input light to coincide with the slope of the cavity's optical-transmission resonance and monitoring the transmitted optical power on a photodiode (similar to the method shown in FIG. 3). The tether resonant frequency can then be detected by observing a peak in the RF spectrum of the photodetector signal.

In operation, the accelerometer 1300 shown in FIGS. 13A-13B measures acceleration along one lateral axis (one dimension). Different directions along that axis can be identified by looking at the direction of the tether frequency shift for each of the two tethers 1320a and 1320b with respect to one another. Acceleration along different axes can be measured by making a second device on the same chip which is rotated by a desired amount, e.g., 90 degrees.

Optical displacement sensing can be sensitive enough to measure displacements due to thermal Brownian motion of small mechanical devices, allowing for resonant frequency detection without the need to actuate the tether motion. To improve the sensitivity of the system, the input light can also be used to excite motion in the mechanical tether via the photo-thermal effect, where positive feedback can lead to limit cycle oscillations in the opto-mechanical system, resulting in dramatically increased mechanical quality factor (Q). In some cases, the mechanical Q may be about $10^5$ or greater. The increased mechanical Q of the sensing tether allows for detection of smaller frequency shifts caused by acceleration of the proof mass.

PIRAs Using Tether-Waveguide Interaction

Figure 14A:
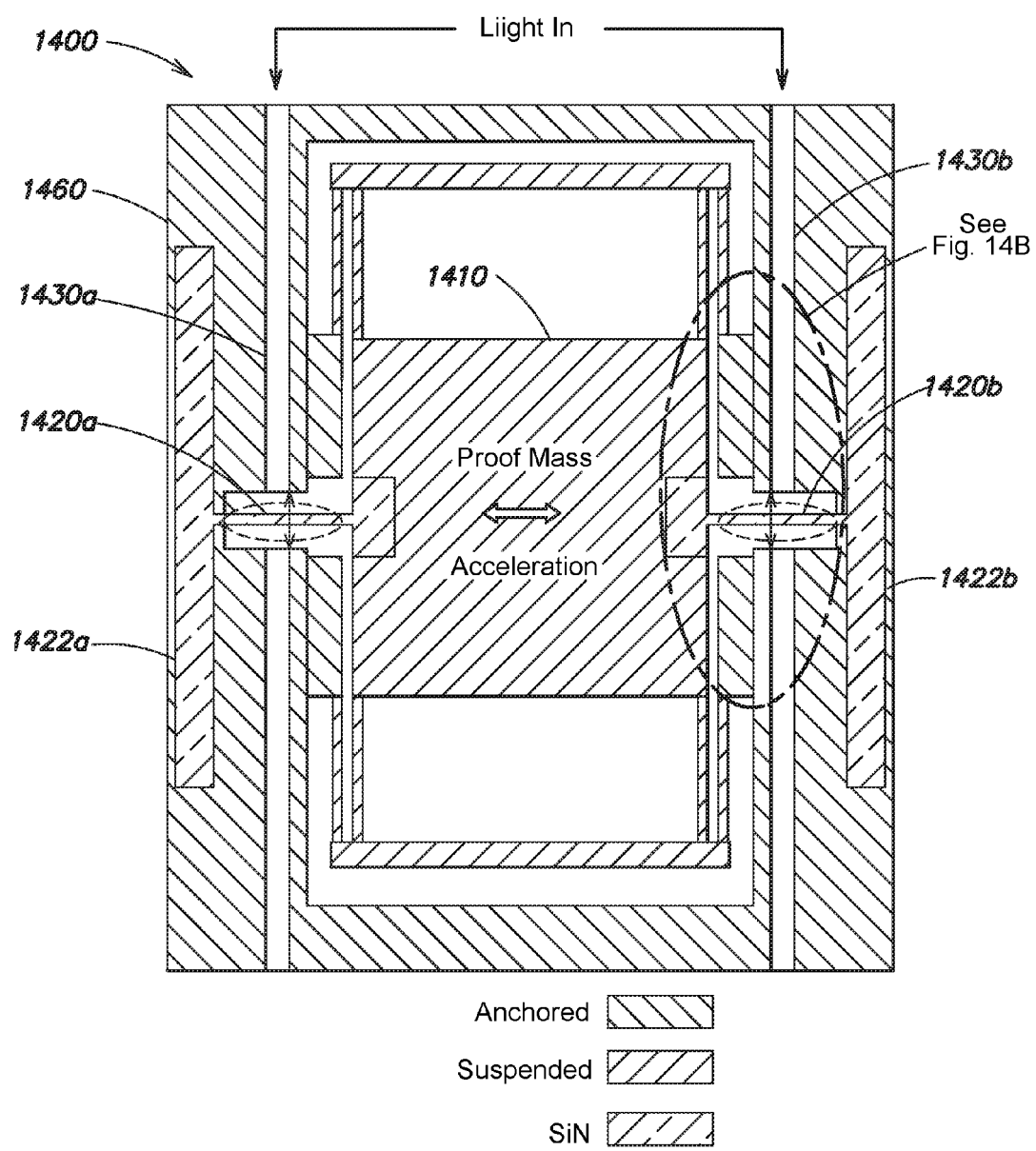
FIGS. 14A-14B show schematics of photonic integrated resonant accelerometers using silicon nitride evanescent sensing to detect acceleration.
Figure 14B:
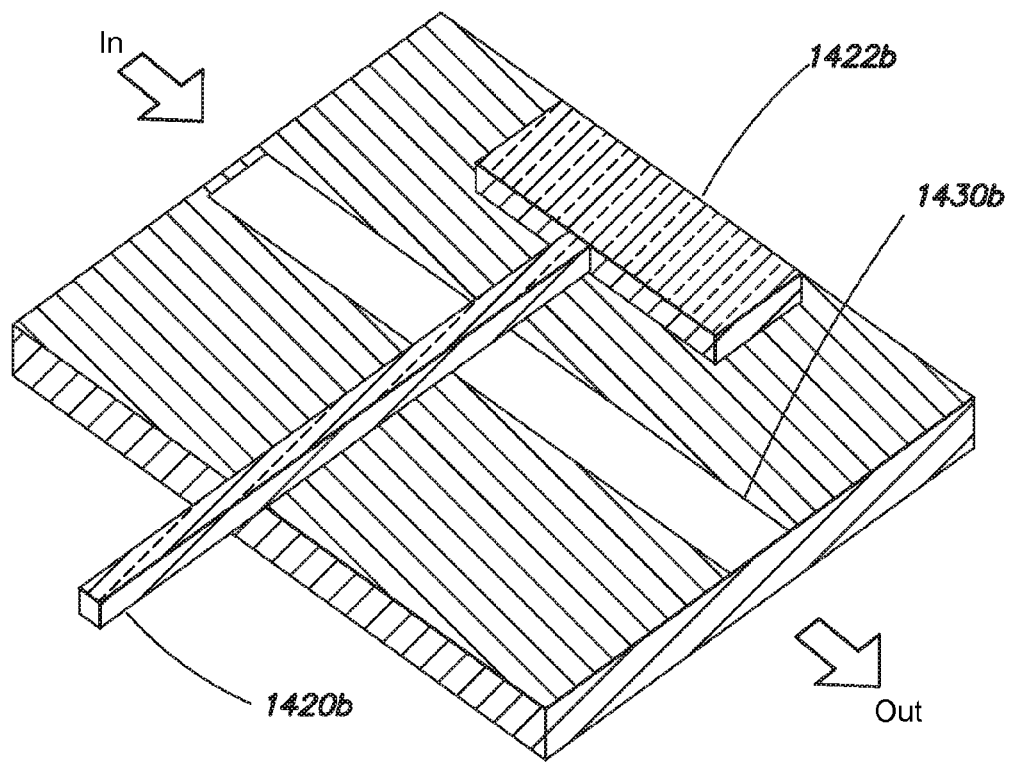

FIGS. 14A-14B show a schematic of an accelerometer 1400 that senses acceleration based on tether-waveguide interactions. The accelerometer 1400 includes a proof mass 1410 suspended by two tethers 1420a and 1420b to two anchors 1422a and 1422b, respectively, on a substrate 1460. Two waveguides 1430a and 1430b are disposed perpendicularly to the longitudinal direction of the two tethers 1420a and 1420b, respectively, but the waveguides 1430a and 1430b are underneath the tethers 1420a and 1420b without direct physical contact. The tethers 1420a and 1420b can be fabricated using stoichiometric silicon nitride deposited using low pressure chemical vapor deposition (LPCVD). These tethers 1420a and 1420b can exhibit extremely high natural Q factors, which allow for high acceleration sensitivity without the need for optically induced motion. The tethers 1420a and 1420b are suspended in close proximity to the underlying waveguides 1430a and 1430b, in which case motions of the tethers 1420a and 1420b can perturb the evanescent field of the waveguide mode and can be detected by either observing the direct transmission of the light or through interferometry.

Figure 15:
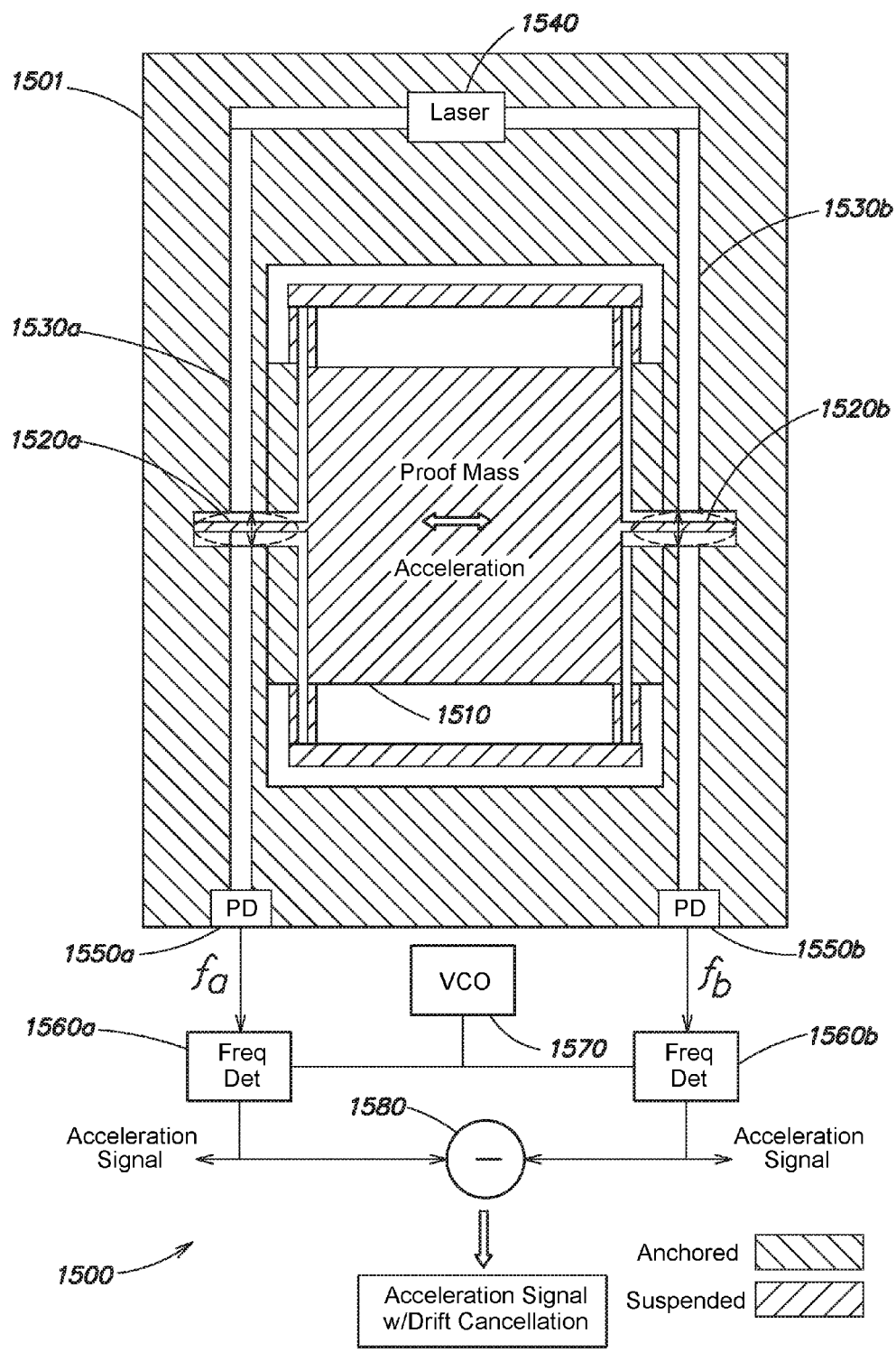
FIG. 15 shows a schematic of a chip-scale photonic integrated resonant accelerometer.

In either way, the accelerometer 1400 can be implemented in a fully integrated, chip-scale manner by integrating all of the optoelectronic components such as lasers and photodiodes onto the same silicon photonic platform, as depicted in FIG. 15. In another example, the detection electronics can also be integrated onto the same platform via wafer-level three-dimensional (3D) bonding of CMOS electronics to photonics wafers.

FIG. 15 show a schematic of an accelerometer 1500 that includes a laser 1540 coupled to a pair of photodetectors 1550a and 1550b via a pair of optical waveguides 1530a and 1530b, which are optically coupled to respective tethers 1520a and 1520b holding a proof mass 1510 from a substrate 1501. In operation, each beam from the laser 1540 propagates through a corresponding waveguide 1530a/b to a corresponding photodetector 1550a/b. As the proof mass 1510 accelerates, the tethers 1520a and 1520b move, causing light propagating through the waveguides 1530a and 1530b to resonate in a cavity whose length changes (e.g., as in FIGS. 13A-13B), and/or to couple out of the waveguides evanescently (e.g., as in FIGS. 14A-14B). This results in changes in the amplitudes and/or phases of the beams propagating through the waveguides 1530a and 1530b.

Phase changes can be detected interferometrically on a single detector 1550a or 1550b. Amplitude changes can be detected using differential detection with a pair of photodetectors 1550a and 1550b as in FIG. 15. Differential detection allows for cancellation of unwanted long-term drift. In addition, differential detection can be performed with different sources, e.g., one source per waveguide. However, performing differential detection using light from the same source 1540 in multiple waveguides 1530a and 1530b can help cancel some noise in the source itself (e.g., relative intensity noise). The signals acquired by the detectors 1550*a* and 1550*b* are transmitted to two frequency detectors 1560*a* and 1560*b*, operably coupled to a frequency reference 1570 (e.g., a voltage-controlled oscillator), to estimate the frequency the tethers 1520*a* and 1520*b*. Based on the estimated tether frequencies, a processing unit 1580 can then calculate the acceleration originally imposed on the proof mass 1510.

Photonic integrated resonant accelerometers may allow for improvements in many device parameters over current MEMS devices including sensitivity, scale factor stability, bias stability, dynamic range, and bandwidth. Many of these limitations stem from the electro-static transduction technique used by conventional devices. The optical system disclosed herein overcomes these limitations while still providing a chip-scale system which can be batch fabricated and maintain low size, weight, power, and cost. The potential applications for this technology have a broad range from industrial sensors to inertial navigation, or any application where the robustness and sensitivity of current accelerometers needs to be improved.

Methods of Fabricating PIRAs Using Linear Resonators and Waveguides

FIGS. 16A-16F shows a fabrication flow of accelerometers using linear resonators (e.g., shown in FIGS. 13A-13B) or tether-waveguide interactions (e.g., shown in FIGS. 14A-14B). In FIG. 16A, a standard silicon-on-insulator (SOI) wafer including a silicon base 1601, an oxide layer 1602, and a device layer 1603 (e.g., silicon), is provided. In FIG. 16B, photonic waveguides 1630 are defined by, for example, partially etching the device layer 1603 similarly to standard silicon photonic techniques. A second oxide layer 1604 is then deposited on the fabricated waveguides 1630, as shown in FIG. 16C.

In FIG. 16D, a sensing tether 1620 is defined by, for example, etching fully through the second oxide layer 1604 and the buried oxide layer 1602 in the wafer until reaching the silicon base 1601. A proof mass 1610 can then be defined by etching fully through the thickness of the silicon base 1601 from the back side using a deep reactive ion etch (DRIE), as shown in FIG. 16E. DRIE is a common tool used in MEMS fabrication techniques. Finally, as shown in FIG. 16F, the sensing tether can be released by using a timed hydrofluoric acid (HF) etch to remove a small amount of silicon dioxide underneath the sensing tether. Since the tether may have cross-sectional dimensions on the order of 1 μm, this etch may remove as little as about 500 nm of oxide from either side of the tether, leaving little lasting damage to the remainder of the oxide on the wafer. If desired, molybdenum can be used protect oxide from the HF etch, as the etch rate is much slower on molybdenum than on the oxide itself.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An accelerometer comprising:
   a proof mass;
   a first tether mechanically coupled to a first side of the proof mass and characterized by a resonant frequency that changes in response to acceleration of the proof mass;
   a first ring resonator evanescently coupled to the first tether, wherein vibration of the first tether causes a change of a first resonance condition of the first ring resonator; and
   a detection system, operably coupled to the first ring resonator, to sense the change of the first resonance condition of the first ring resonator.

2. The accelerometer of claim 1, wherein the first tether comprises at least one of silicon or silicon nitride.

3. The accelerometer of claim 1, wherein the first tether has a width substantially equal to or less than 1 μm.

4. The accelerometer of claim 1, wherein the first tether has an internal tensile stress substantially equal to or greater than 500 MPa.

5. The accelerometer of claim 1, wherein the vibration of the first tether has a vibration frequency of about 50 KHz to about 1 GHz.

6. The accelerometer of claim 1, wherein a distance between the first ring resonator and the first tether is about 100 nm to about 300 nm.

7. The accelerometer of claim 1, wherein the detection system comprises:
   a waveguide, evanescently coupled to the first ring resonator, to guide light past the first ring resonator so as to couple a portion of the light into the first ring resonator; and
   a detector, optically coupled to the waveguide, to detect a change in the portion of the light coupled into the first ring resonator caused by the change of the first resonance condition of the first ring resonator.

8. The accelerometer of claim 7, further comprising:
   a substrate to support the first ring resonator and the detector; and
   a semiconductor laser, fabricated in the substrate and optically coupled to the first ring resonator, to provide the light.

9. The accelerometer of claim 7, wherein the light has a power greater than 0.2 mW so as to cause an opto-mechanical oscillation of the first tether.

10. The accelerometer of claim 1, further comprising:
    a second tether mechanically coupled to a second side, opposite the first side, of the proof mass, the second tether being characterized by a second resonant frequency that changes in response to the acceleration of the proof mass; and
    a second ring resonator, evanescently coupled to the second tether, wherein vibration of the second tether causes a change of a second resonance condition of the second ring resonator,
    wherein the detection system senses the change of the second resonance condition of the second ring resonator.

11. The accelerometer of claim 1, further comprising:
    an opto-mechanical oscillator, operably coupled to the detection system, to monitor a temperature fluctuation of the accelerometer.

12. The accelerometer of claim 1, further comprising:
    a heater, thermally coupled to the first tether, to keep the first tether at a constant temperature so as to mitigate thermal drift.

13. A method of sensing acceleration with an accelerometer comprising a proof mass, a first tether mechanically coupled to a first side of the proof mass and characterized by a resonant frequency that changes in response to acceleration of the proof mass, and a first ring resonator evanescently coupled to the first tether, the method comprising:
    detecting a change of a first resonance condition of the first ring resonator caused by a change of the resonant frequency of the tether due to vibration of the first tether; and
    estimating the acceleration based at least in part on the change of the first resonance condition of the first ring resonator in response to acceleration of the proof mass.

14. The method of claim 13, wherein detecting the change of the first resonance condition of the first ring resonator comprises:
    detecting a change in an amount of light evanescently coupled into the first ring resonator.

15. The method of claim 14, wherein transmitting the light comprises transmitting the light at a power greater than 0.2 mW so as to cause opto-mechanical oscillation of the first tether in the accelerometer.

16. The method of claim 13, wherein the accelerometer further comprises a second tether mechanically coupled to a second side, opposite the first side, of the proof mass, a second ring resonator evanescently coupled to the second tether, the method further comprising:
    detecting a change of a second resonance condition of the second ring resonator caused by vibration of the second tether in response to the acceleration of the proof mass; and
    estimating the acceleration based at least in part on the change of the first resonance condition of the first ring resonator and the change of the second resonance condition of the second ring resonator.

17. The method of claim 13, further comprising:
monitoring a temperature fluctuation of the accelerometer using an opto-mechanical oscillator.
18. The method of claim 13, further comprising:
maintaining the first tether at a constant temperature so as to mitigate thermal noise in sensing the acceleration.

* * * * *